US012641831B2

(12) United States Patent　　　　(10) Patent No.:　US 12,641,831 B2

Chou et al.　　　　　　　　　　　　(45) Date of Patent:　May 26, 2026

(54) GATE STRUCTURES OF SEMICONDUCTOR DEVICES AND FABRICATION METHODS THEREOF

(71) Applicant: Taiwan Semiconductor Manufacturing Company, Ltd., Hsin-Chu (TW)

(72) Inventors: Hung-Ju Chou, Hsinchu (TW); Chih-Chung Chang, Nantou County (TW); Yao-Hsuan Lai, Taoyuan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 423 days.

(21) Appl. No.: 18/333,708

(22) Filed: Jun. 13, 2023

(65) Prior Publication Data

US 2024/0421204 A1　　Dec. 19, 2024

(51) Int. Cl.
　　H10D 30/67　　　(2025.01)
　　H10D 64/01　　　(2025.01)

(52) U.S. Cl.
　　CPC ....... H10D 30/6735 (2025.01); H10D 64/017 (2025.01)

(58) Field of Classification Search
　　CPC ............. H10D 30/6735; H10D 64/017; H10D 64/519; H10D 30/501; H10D 30/019
　　See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2022/0059533 | A1* | 2/2022 | Bae ........................ H10D 30/43 |
| 2023/0065056 | A1 | 3/2023 | Lin et al. |

FOREIGN PATENT DOCUMENTS

| | | |
|---|---|---|
| CN | 110610859 A | 12/2019 |
| TW | 202315122 A | 4/2023 |

* cited by examiner

*Primary Examiner* — Changhyun Yi
(74) *Attorney, Agent, or Firm* — HAYNES AND BOONE, LLP

(57)　　　ABSTRACT

A method of forming a semiconductor structure includes depositing a dummy material stack over a fin, patterning a top portion of the dummy material stack in a first etching process, patterning a middle portion of the dummy material stack in a second etching process, patterning a bottom portion of the dummy material stack in a third etching process to form a dummy gate stack, and replacing the dummy gate stack with a metal gate stack. The second etching process is weaker than the first etching process, and the third etching process is weaker than the second etching process.

20 Claims, 24 Drawing Sheets

100

100

164

II

II

160

I

174

164

I

132

116

102

132

Z

Y

X

GATE STRUCTURES OF SEMICONDUCTOR DEVICES AND FABRICATION METHODS THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate semiconductor devices have been introduced in an effort to improve gate control by increasing gate-channel coupling, reduce OFF-state current, and reduce short-channel effect (SCE). One such multi-gate semiconductor device that has been introduced is the gate-all around transistor (GAA). The GAA device gets its name from the gate structure which extends around the channel region providing access to the channel region on four sides, which allows for fuller depletion in the channel region and results in less short-channel effect due to steeper sub-threshold current swing (SS) and smaller drain induced barrier lowering (DIBL). The GAA device provides a channel region in the form of stacked channel layers. However, as transistor dimensions are continually scaled down to sub-3 nm technology nodes, maintaining gate control and mitigating SCE and DIBL can be challenging. While the current methods have been satisfactory in many respects, as transistor dimensions are aggressively scaled down, further improvements of the multi-gate semiconductor devices are still needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
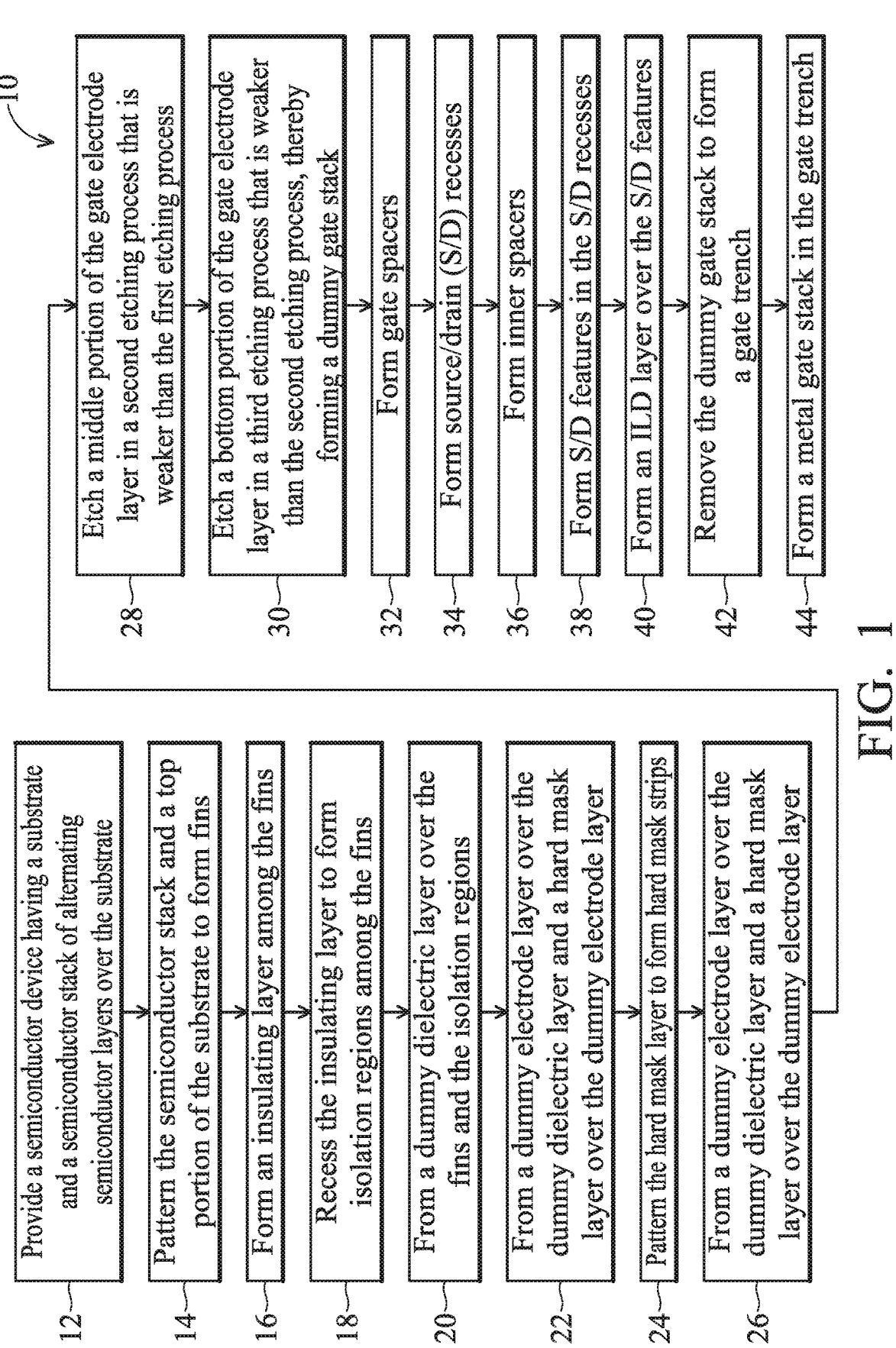
FIG. 1 shows a flow chart of a method for forming a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath." "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with a gate structure having a footprint profile proving tapering (increasing) gate critical dimensions (CDs). These multi-gate devices may include a p-type metal-oxide-semiconductor device or an n-type metal-oxide-semiconductor device. Presented herein are specific embodiments of a type of multi-gate transistor referred to as a gate-all-around (GAA) device. A GAA device includes any device that has its gate structure, or portion thereof, formed on four sides of a channel region (e.g., surrounding a portion of a channel region). The channel region includes a stacked of channel layers (or referred to as channel members) in the form of nanosheet, nanowire, bar, and/or other suitable channel configuration associated with a single, contiguous gate structure. However, one of ordinary skill would recognize that the teaching can apply to a single channel layer (e.g., single nanowire/nanosheet) or any number of channel layers. One of ordinary skill may recognize other examples of semiconductor devices—such as FinFET transistors—that may benefit from aspects of the present disclosure.

One advancement implemented as technology nodes shrink, in some IC designs, such as multi-gate devices designs, has been the replacement of a dummy gate (e.g., a polysilicon gate) with a metal gate (e.g., a high-k metal gate) to improve device performance with decreasing feature sizes. One process of forming a metal gate is termed a replacement gate or "gate-last" process in which the metal gate is fabricated "last" to replace an earlier formed dummy gate, which allows for a reduced number of subsequent processes. Generally, a gate patterning process in forming a dummy gate targets at providing a vertical gate sidewall profile, particularly a vertical corner profile in the intersecting junctions where the dummy gate structure, the fin-shaped epitaxial stack, and a top surface of the substrate meet (top portions of the substrate may include isolation regions, as will be explained in further details below). The vertical corner profile improves gate CD uniformity. As a comparison, embodiments of the present disclosure intentionally bring in gate CD non-uniformity and introduce a "protruding corner" (or referred to as "protruding footing") to the gate sidewall profile. In some embodiments, multiple etching steps with different etching strengths are applied during the gate patterning process to form a gate structure with a tapering gate sidewall. The footprint of the tapering gate sidewall forms the "protruding corner." At the protruding corner, the gate CD is larger than the gate CD above the fin-top surface. A larger gate CD provides stronger gate drive capability and thus mitigates short-channel effect (SCE) and drain induced barrier lowering (DIBL).

FIG. 1 illustrates a flow chart of a method 10 for forming a semiconductor device 100 (or device 100) in accordance with some embodiments. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-24, which illustrate various perspective views and cross-sectional views of the device 100 during intermediate fabrication steps according to the method 10. The device 100 is provided for illustration purposes and does not necessarily limit the embodiments of the present disclosure to any number of devices, any number of regions, or any configuration of structures or regions. For example, the device 100 illustrated in the following embodiments may be applied to, but not limited thereto, gate-all-around (GAA) FET, fin field-effect transistor (FinFET), or other transistors including multi-gate structures.

Figure 2:
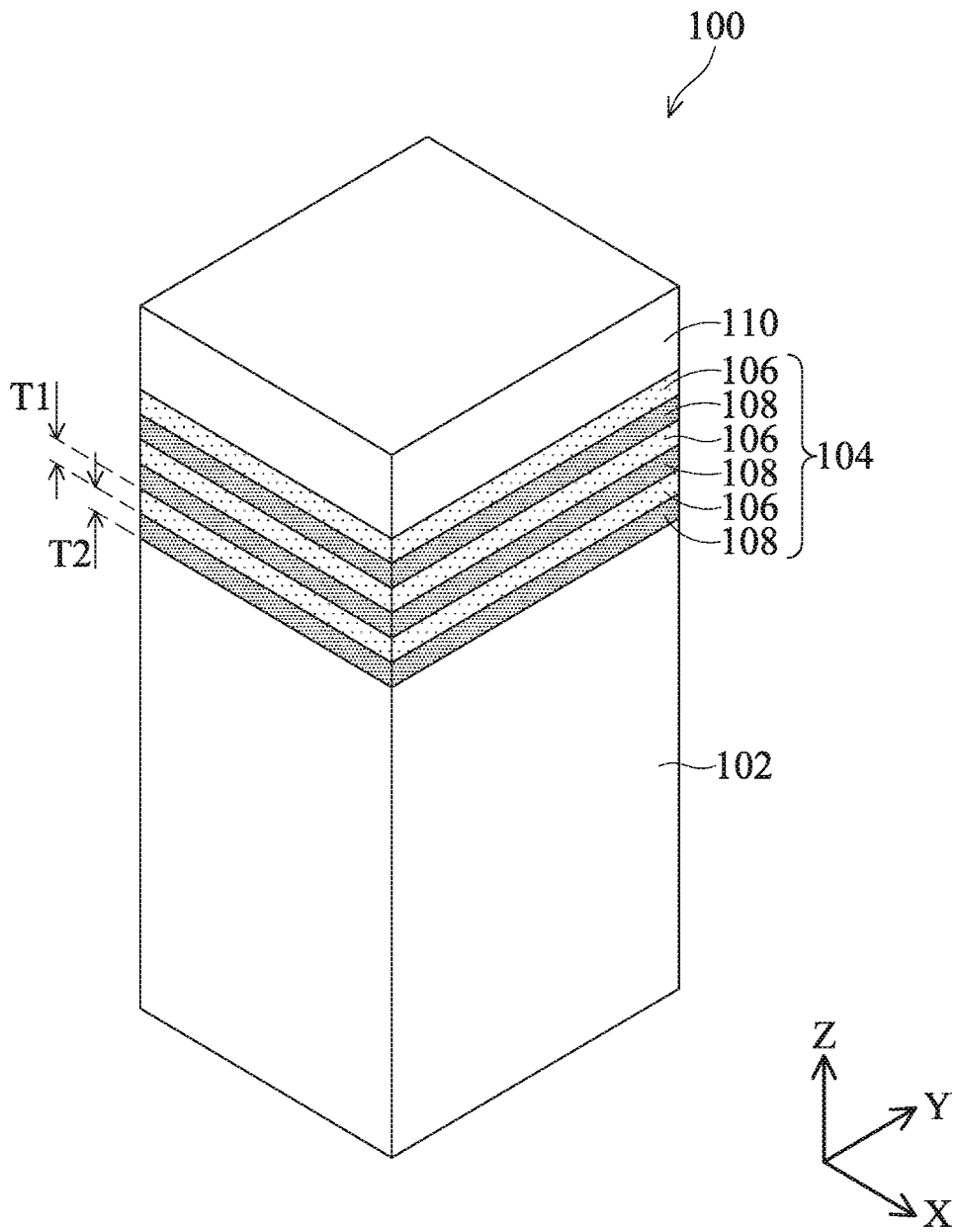
FIGS. 2, 3, 4, 5, 6, 7, 8, 9, 10, 11, 12, and 19 illustrate perspective views of a semiconductor structure during a fabrication process according to the method of FIG. 1, in accordance with some embodiments of the present disclosure.

Referring to FIGS. 1 and 2, at operation 12, the method 10 provides, or is provided with, a device 100 having a substrate 102. In some embodiments, the substrate 102 includes a crystalline silicon substrate (e.g., wafer). The substrate 102 may include various doped regions (e.g., p-type well and/or n-type well) depending on design requirements. In some embodiments, the doped regions may be doped with p-type or n-type dopants. For example, the doped regions may be doped with p-type dopants, such as boron or BF$_2$, n-type dopants, such as phosphorus or arsenic, and/or combinations thereof. The doped regions may be configured for n-type transistors, or alternatively, configured for p-type transistors. In some embodiments, an anti-punch-through (APT) implantation is performed on a top portion of the substrate 102 to form an APT region. The conductivity type of the dopants implanted in the APT region is the same as that of the doped regions (or wells). The APT region may extend under the subsequently formed source/drain (S/D) regions, and are used to reduce the leakage from the S/D regions to substrate 102. For clarity, the doped regions and the APT region are not illustrated in FIG. 1 and subsequent drawings. In some alternative embodiments, the substrate 102 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 2, a semiconductor stack 104 is formed on the substrate 102. The semiconductor stack 104 may include a plurality of first layers 106 and a plurality of second layers 108 stacked alternately in a Z-direction. Although only three first layers 106 and three second layers 108 are illustrated in FIG. 2, the embodiments of the present disclosure are not limited thereto. In other embodiments, the number of the first layers 106 and the second layers 108 are adjusted by the need, such as one, two, four, or more first layers 106 and second layers 108.

In some embodiments, the first layers 106 and the second layers 108 include different materials. For example, the second layers 108 are SiGe layers having a germanium atomic percentage in the range between about 15% and 40%, and the first layers 106 are Si layers free from germanium. However, the embodiment of the disclosure is not limited thereto, in other embodiments, the first layers 106 and the second layers 108 have materials with different etching selectivity. In some embodiments, the first layers 106 and the second layers 108 are formed by an epitaxial growth process, such as a molecular beam epitaxy (MBE) process, a metalorganic chemical vapor deposition (MOCVD) process, or the like. Therefore, the semiconductor stack 104 may also be referred to as the epitaxial semiconductor stack 104. In the case, the first layers 106 are epitaxial Si layers, and the second layers 108 are epitaxial SiGe layers. In some alternative embodiments, the first layers 106 and the second layers 108 are formed by a suitable deposition, such as chemical vapor deposition (CVD), atomic layer deposition (ALD), or the like.

The first layers 106 and the second layers 108 may have the same or different thicknesses. In some embodiments, the first layers 106 have the same thickness T1 and the second layers 108 have the same thickness T2. In some embodiments, the thickness T1 ranges from about 5 nm to about 20 nm and the second thickness T2 ranges from about 5 nm to about 20 nm. Alternatively, the top to bottom first layers 106 may have different thicknesses, and the top to bottom second layers 108 may have different thicknesses.

As shown in FIG. 2, a mask layer 110 is formed on the semiconductor stack 104. The mask layer 110 may include a single-layered structure, a two-layered structure, or a multi-layered structure. For example, the mask layer 110 includes a silicon oxide layer and a silicon nitride layer on the silicon oxide layer. In some embodiments, the mask layer 110 is formed by CVD, ALD, or the like.

Figure 3:
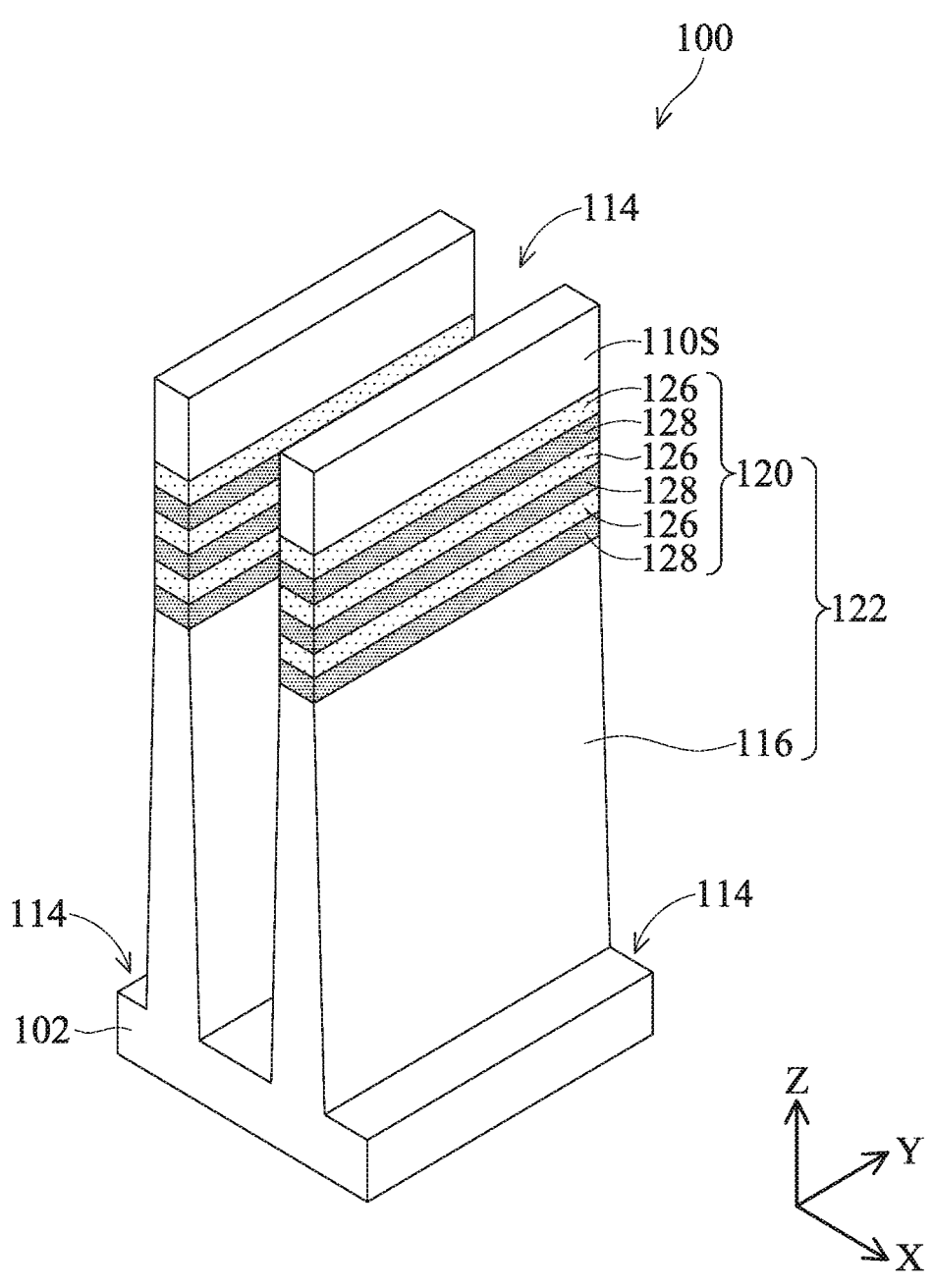

Referring to FIGS. 1 and 3, at operation 14, the method 10 patterns the mask layer 110 to form a plurality of mask strips 110S. The semiconductor stack 104 and the substrate 102 are then patterned by using the mask strips 110S as a mask, so as to form a plurality of trenches 114. In the case, a plurality of fin bases 116 and a plurality of stacks of semiconductor strips 120 on the fin bases 116 are formed between the trenches 114. The trenches 114 extend into substrate 102 and have lengthwise directions parallel to each other. Herein, the stacks of semiconductor strips 120 are referred to as nanosheet stacks 120 and the combination of the fin bases 116 and the nanosheet stacks 120 thereon are referred to as fins 122 due to the fin-like shape. As shown in FIG. 3, the nanosheet stack 120 includes a plurality of first nanosheets 126 (by patterning the first layers 106) and a plurality of second nanosheets 128 (by patterning the second layers 108) stacked alternately along a Z-direction and extending along a Y-direction. As explained in further detail below, the nanosheets 126 or portions thereof may form channel layers of the multi-gate device, and the nanosheet 128 may eventually be removed and serve to define a vertical distance between the channel layers. The nanosheet 126 may also be referred to as channel layers (or channel members) 126, and the nanosheet 128 may also be referred to as sacrificial layers 128.

In some embodiments, the fins 122 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 122.

Although only two fins 122 are illustrated in FIG. 3, the embodiments of the present disclosure are not limited thereto. In other embodiments, the number of the fins 122 may be adjusted by the need, such as one fin, three fins, four fins, or more fins. In addition, the mask strips 110S illustrated in FIG. 3 have flat top surfaces. However, the embodiments of the present disclosure are not limited thereto. In other embodiments, the mask strips 110S may have dome top surfaces due to the high aspect ratio etching.

Figure 4:
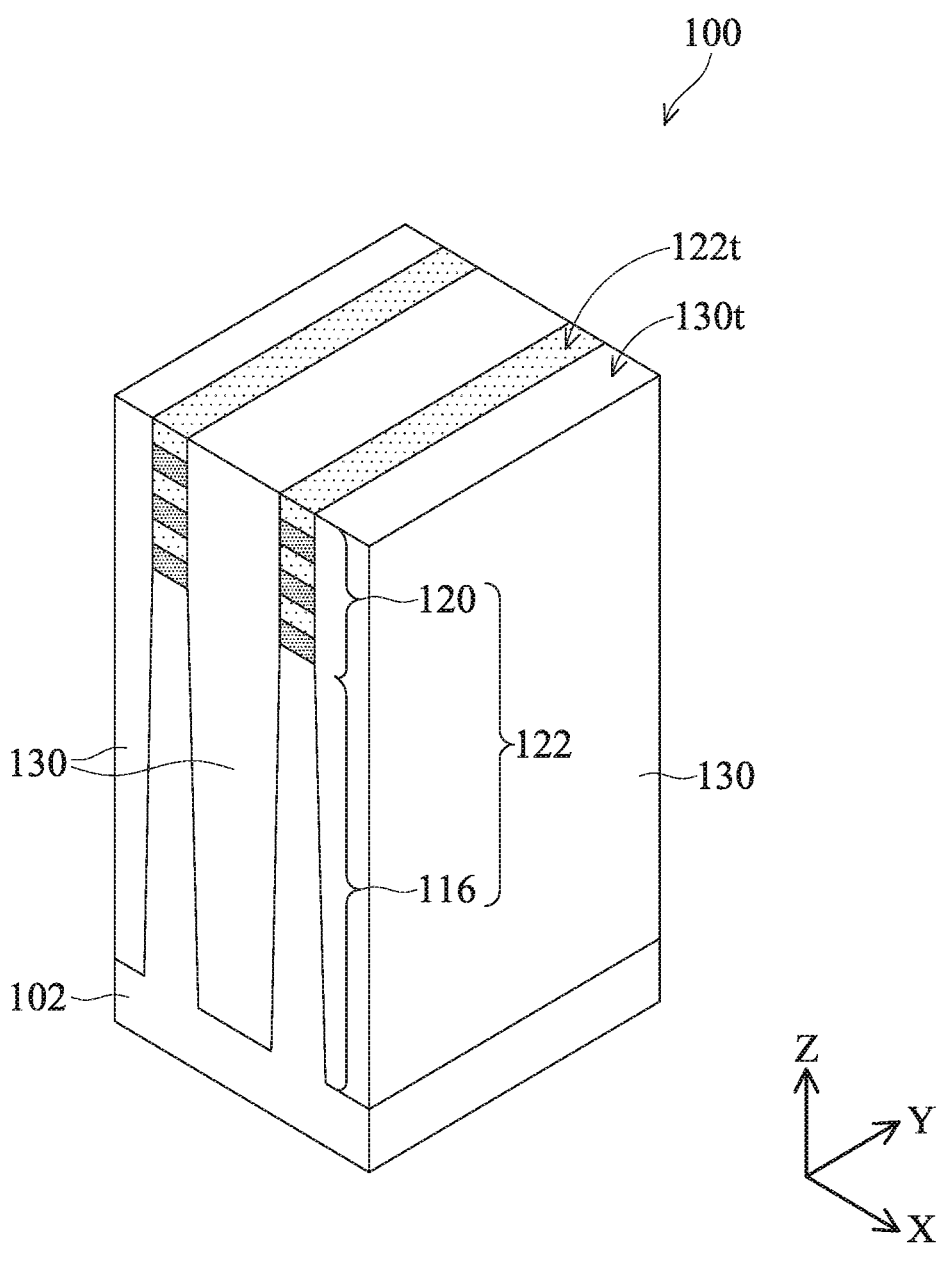

Referring to FIGS. 1 and 4, at operation 16, the method 10 forms an insulating layer 130 in the trenches 114. In some embodiments, an insulating material is formed on the substrate 102 to cover the fins 122 and to fill up the trenches 114. In addition to the fins 122, the insulating material further covers the mask strips 110S. The insulating material may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material may be formed by flowable chemical vapor deposition (FCVD), high-density-plasma chemical vapor deposition (HDP-CVD), sub-atmospheric CVD (SACVD), or spin on. A planarization process may be performed, to remove a portion of the insulating material and the mask strips 110S until the fins 122 are exposed. In the case, as shown in FIG. 4, top surfaces 122t (also referred to as fin-top surfaces, or fin-top) of the fins 122 are substantially coplanar with a top surface 130t of the planarized insulating layer 130. In some embodiments, the planarization process includes a chemical mechanical polish (CMP), an etching back process, a combination thereof, or the like.

Figure 5:
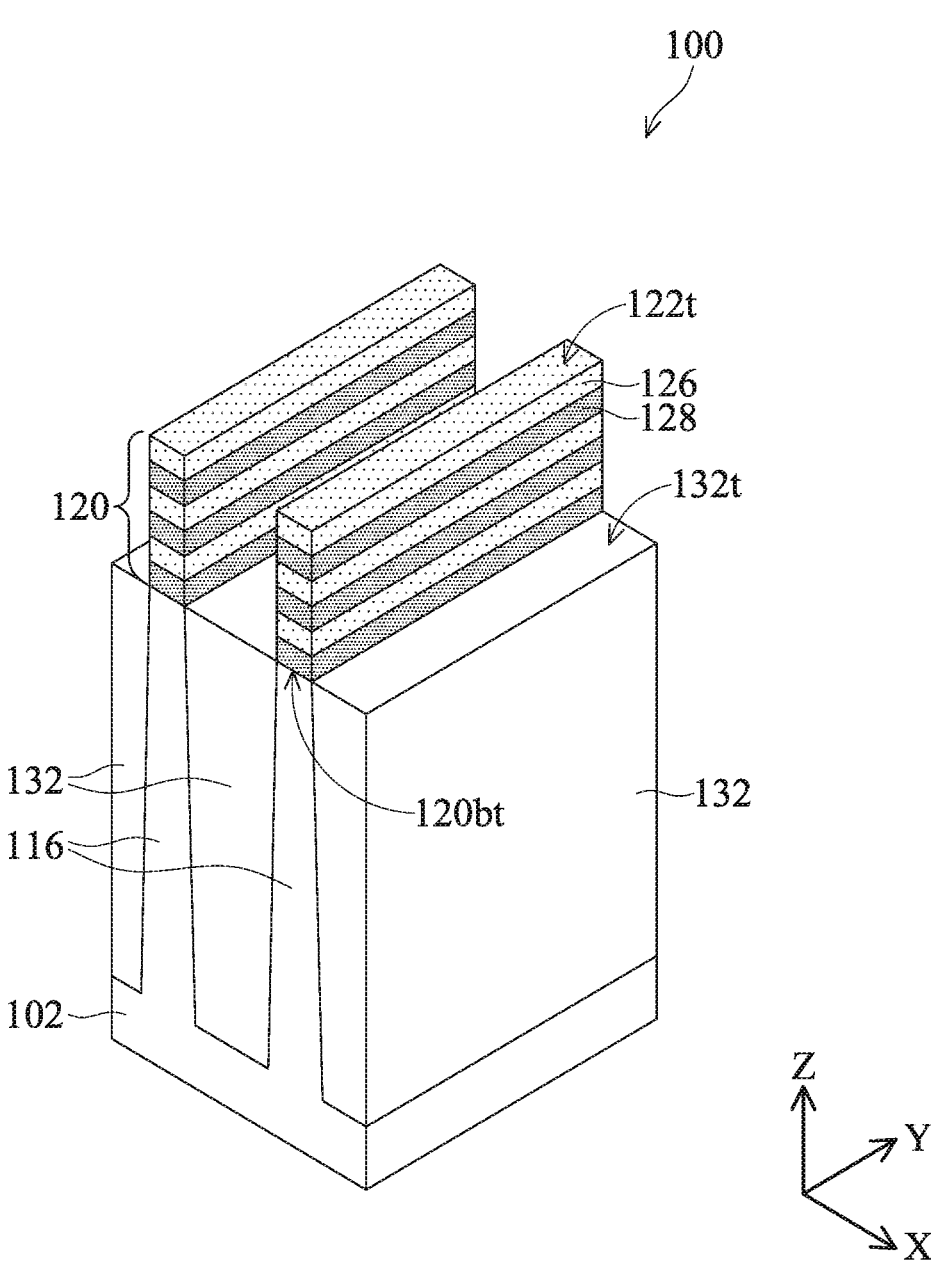

Referring to FIGS. 1 and 5, at operation 18, the method 10 recesses the insulating layer 130 to form a plurality of isolation regions 132. After recessing the insulating layers 130, the fins 122 protrude from top surfaces 132t of the isolation regions 132. That is, the top surfaces 132t of the isolation regions 132 may be lower than the top surfaces 122t of the fins 122. In some embodiments, the nanosheet stacks 120 are exposed by the isolation regions 132. That is, the top surfaces 132t of the isolation regions 132 may be substantially coplanar with or lower than bottom surfaces 120bt of the nanosheet stacks 120. Further, the top surfaces 132t of the isolation regions 132 may have a flat surface as illustrated, a convex surface, a concave surface (such as dishing), or a combination thereof. In some embodiments, the insulating layers 130 are recessed by using an appropriate etching process, such as a wet etching process with hydrofluoric acid (HF), a dry etching process, or a combination thereof. In some embodiments, a height difference between the top surfaces 122t of the fins 122 and the top surfaces 132t of the isolation regions 132 ranges from about 30 nm to about 100 nm. In some embodiments, the isolation regions 132 may be shallow trench isolation (STI) regions, deep trench isolation (DTI) regions, or the like.

Figure 6:
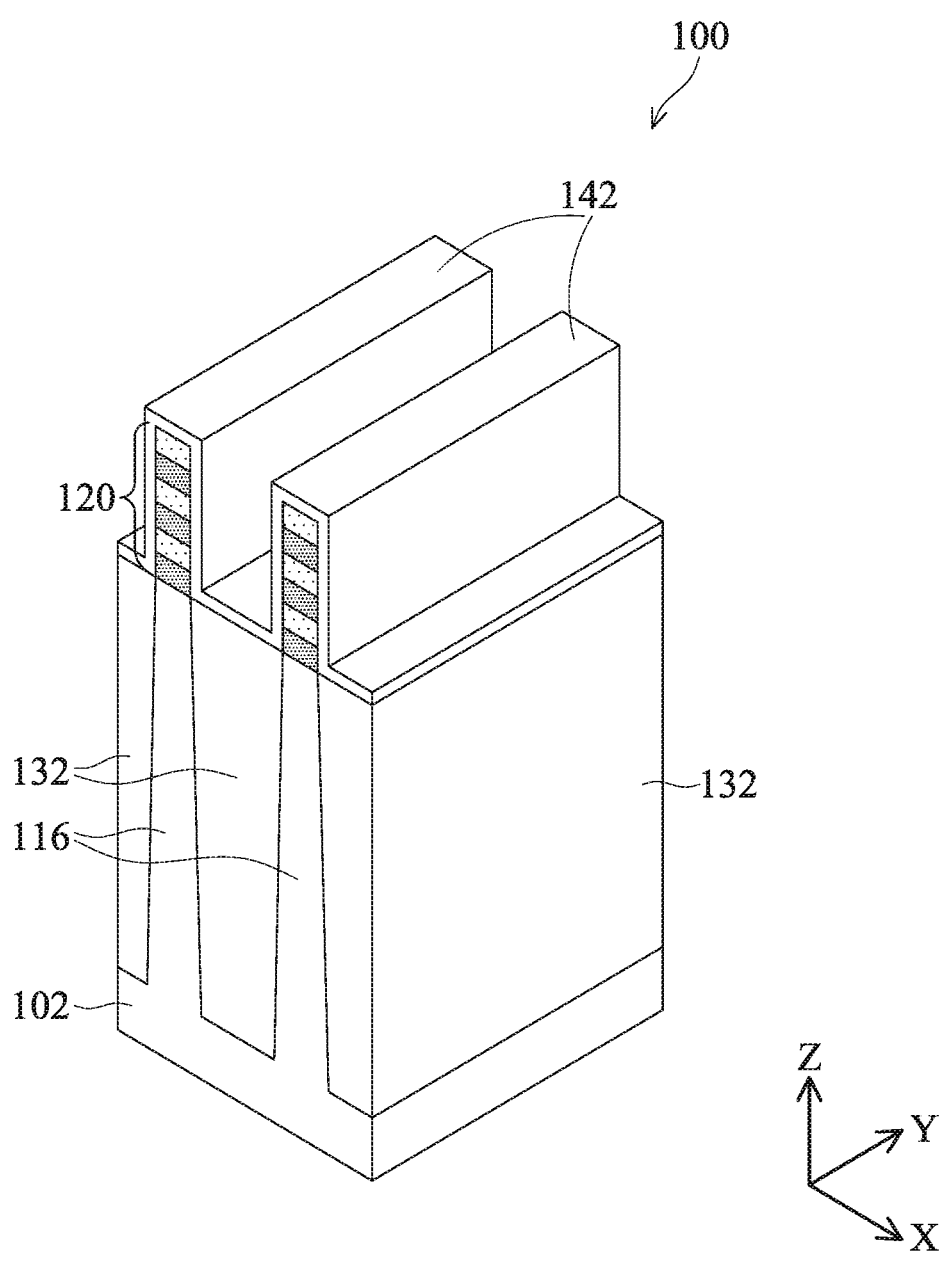

Referring to FIGS. 1 and 6, at operation 20, the method 10 forms a dummy dielectric layer 142 on the substrate 102. In some embodiments, the dummy dielectric layer 142 conformally covers the exposed surfaces of the fins 122 (the nanosheet stacks 120) and the top surfaces 132t of the isolation regions 132. The dummy dielectric layer 142 may be formed by thermal oxidation, CVD, sputtering, or any other methods known and used in the art for forming a dummy dielectric layer. In some embodiments, the dummy dielectric layer 142 may be formed of a same material as the isolation regions 132. In other embodiments, the dummy dielectric layer 142 may be made of one or more suitable dielectric materials such as silicon oxide, silicon nitride, silicon oxynitride, low-k dielectrics such as carbon doped oxides, extremely low-k dielectrics such as porous carbon doped silicon dioxide, a polymer such as polyimide, the like, or a combination thereof. In other embodiments, the dummy dielectric layer 142 includes dielectric materials having a high dielectric constant (k value), for example, greater than 3.9. The materials may include silicon nitrides, oxynitrides, metal oxides such as $HfO_2$, $HfZrO_x$, HfSiO, $HfTiO_x$, $HfAlO_x$, the like, or combinations and multi-layers thereof.

Figure 7:
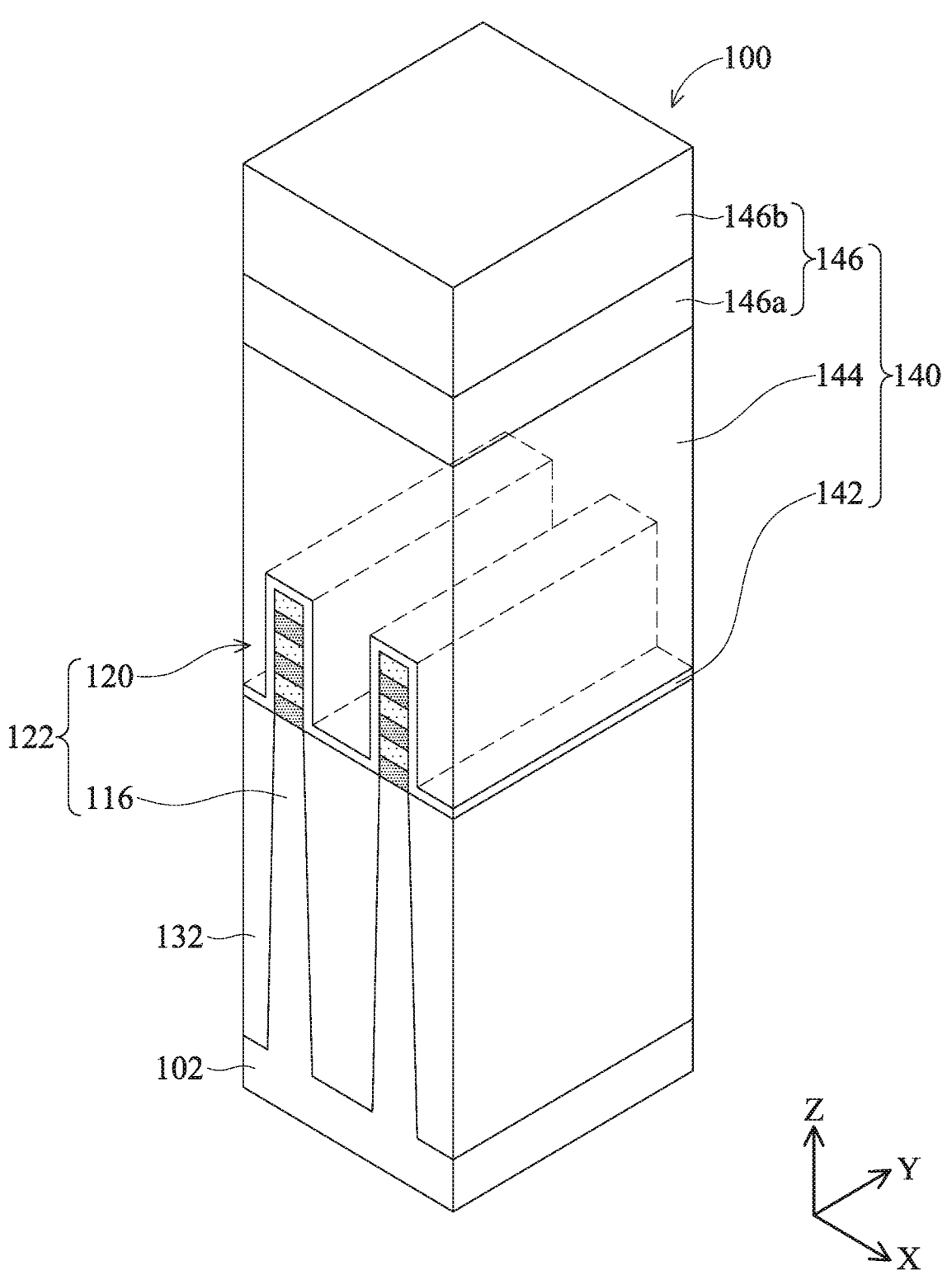

Referring to FIGS. 1 and 7, at operation 22, the method 10 forms a dummy electrode layer 144 covering the dummy dielectric layer 142 and a hard mask layer 146 covering the dummy electrode layer 144. The dummy dielectric layer 142, the dummy electrode layer 144, and the hard mask layer 146 are collectively referred to as the dummy gate material stack 140. The dummy gate material stack 140 will be subsequently patterned to form a dummy gate stack, which will be used to define and form the source/drain regions. The dummy gate stack will then be removed to allow processing to be performed to the fins in the channel region, and a metal gate stack will be formed over the channel region.

The dummy electrode layer 144 is formed over the dummy dielectric layer 142. In some embodiments, the dummy electrode layer 144 is a conductive material and may be selected from a group comprising polycrystalline-silicon (poly-Si), polycrystalline silicon-germanium (poly-SiGe), metallic nitrides, metallic silicides, metallic oxides, and metals. In an embodiment, the dummy electrode layer 144 may be deposited by PVD, CVD, sputter deposition, or other techniques known and used in the art for depositing conductive materials. Other materials, conductive and non-conductive, may be used. The top surface of the dummy electrode layer 144 usually has a non-planar top surface and may be planarized after it is deposited.

Also shown in FIG. 7 is a hard mask layer 146 formed over the dummy electrode layer 144. The hard mask layer 146 comprises one or more masking layers and will be used to pattern the dummy electrode layer 144 to form a dummy gate electrode. In some embodiments, the hard mask layer 146 comprises a first hard mask layer 146a and a second hard mask layer 146b. The first hard mask layer 146a may be an oxide layer (e.g., silicon oxide) and the second hard mask layer 146b may be a nitride layer (e.g., silicon nitride). The first hard mask layer 146a and the second hard mask layer 146*b* may be deposited through a process such as CVD, or a spin-on-glass process, although any acceptable process may be utilized. In some embodiments, the first hard mask layer 146*a* may have a thickness from about 10 Å to about 50 Å, and the second hard mask layer 146*b* may have a thickness from about 150 Å to about 850 Å.

Figure 8:
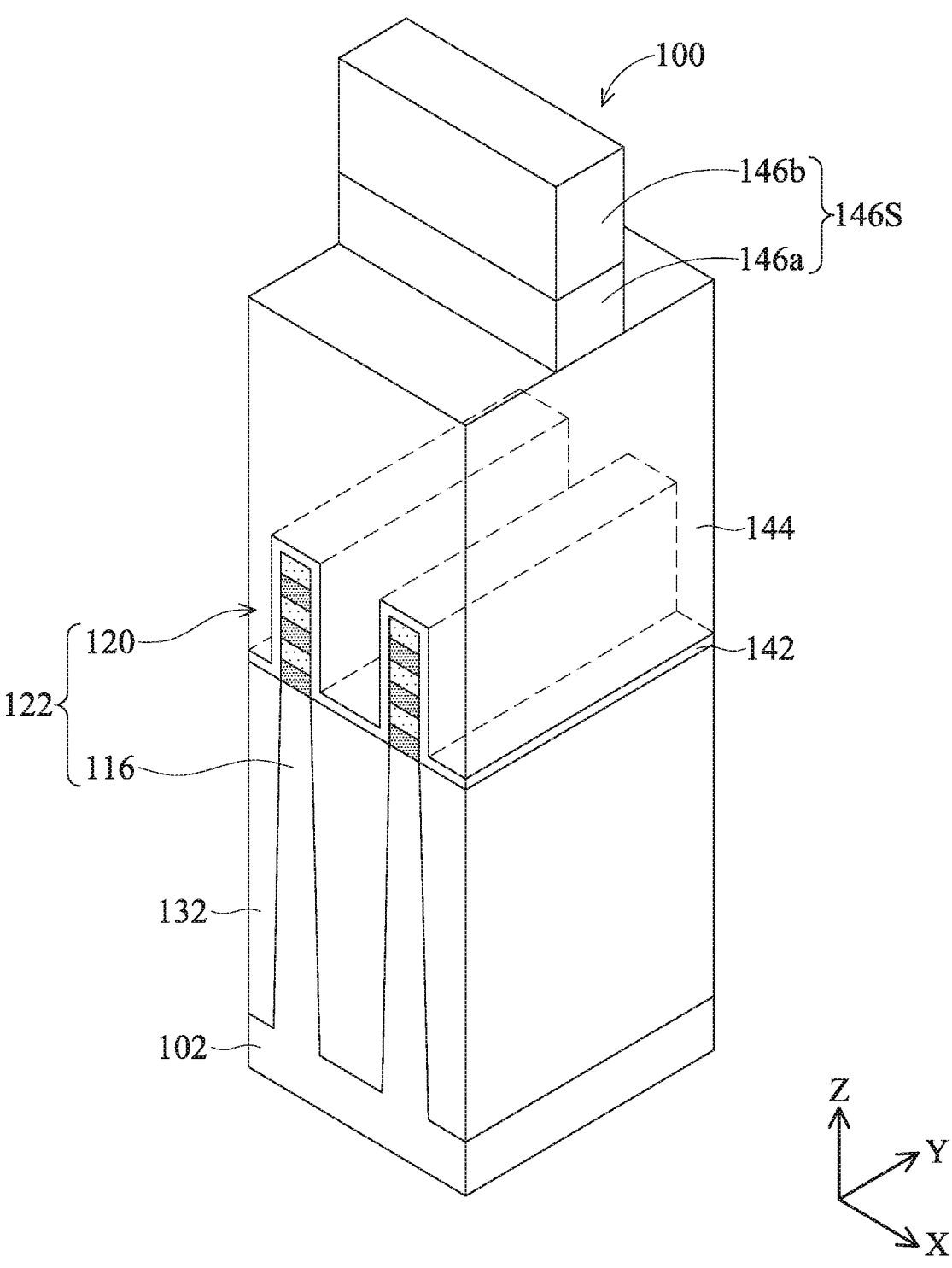

Referring to FIGS. 1 and 8, at operation 24, the method 10 patterns the hard mask layer 146 to form a plurality of hard mask strips 146S. Although a single hard mask stripe 146S is illustrated in FIG. 8, the embodiments of the present disclosure are not limited thereto. In other embodiments, the number of the hard mask stripe 146S may be adjusted by the need, such as two stripes, three stripes, or more stripes. The hard mask strip 146S extends along an X-direction perpendicular to the lengthwise direction of the fins 122. As to be discussed in further detail below, a pattern defined in the hard mask strips 146S will be transferred to the underneath dummy electrode layer 144 and dummy dielectric layer 142 to form a dummy gate stack that crosses over the fins 122.

In some embodiments, the method 10 at operation 24 uses a lithography process that includes forming a resist layer (not shown) over the hard mask layer 146 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, e-beam writing, ion-beam writing, or combinations thereof. The method 10 at operation 24 subsequently etches the second hard mask layer 146*b* and the first hard mask layer 146*a* through the openings defined in the patterned resist layer. The etching process may include wet etching, dry etching, reactive ion etching (RIE), ashing, and/or other suitable technique. The patterned resist layer may be stripped from the device 100 following the forming of the hard mask stripes 146S.

In addition, the hard mask strip 146S illustrated in FIG. 8 has a flat top surface. However, the embodiments of the present disclosure are not limited thereto. In other embodiments, the hard mask strip 146S may have a dome top surface due to the high aspect ratio etching.

Figure 9:
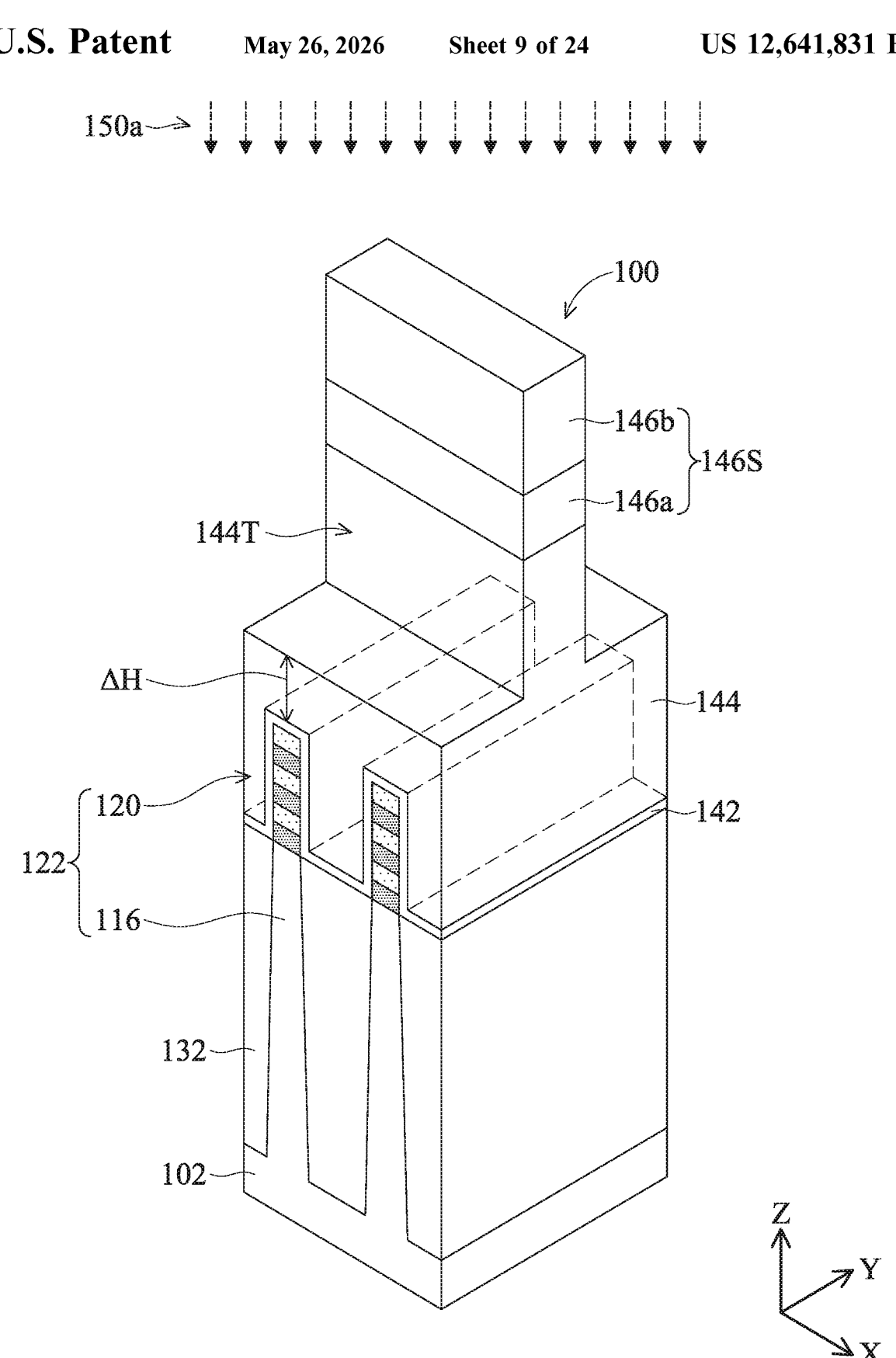

Referring to FIGS. 1 and 9, at operation 26, the method 10 etches a top portion of the dummy electrode layer 144 through the openings defined in the hard mask strips 146S. In this manner, the hard mask strips 146S serve as an etching mask. Generally, the dummy electrode layer 144 is patterned in one anisotropic etching step to expose the fins 122 thereunder, such as in a plasma etching process with high power and high bias to ensure a strong etching directivity. The patterned dummy electrode layer 144 of a resultant structure generally has substantially vertical sidewalls. In other words, the gate CD may be substantially maintained the same from gate top to gate bottom (i.e., at the top surface

132*t* of the isolation region 132). However, as transistor dimensions are continually scaled down to sub-3 nm technology nodes, maintaining gate control can be challenging. In some IC applications, there is a need to increase gate CD, particularly gate CD at the bottom of the channel region, to mitigate SCE and DIBL. To intentionally introduce a tapering gate CD profile to achieve a larger gate CD and a stronger gate control closer to the bottom of the nanosheet stack 120, as to be explained in greater detail below, the method 10 includes multiple etching steps to pattern the dummy electrode layer 144 instead of one single etching step. The multiple etching steps employ a stronger etching step followed by one or more weaker etching steps in order to reduce the etching strength when the etching approaches the gate bottom, thereby intentionally bringing in a tapering gate sidewall thus a tapering gate CD profile (FIG. 14) at intersections of the gate stack and the underneath protruding fins. The multiple etching steps are in-situ in some embodiments.

In some embodiments, operation 26 includes a plasma etching process. In furtherance of the embodiments, operation 26 includes a first reactive ion etch (RIE) step 150*a*. The first RIE step 150*a* is the strongest one, in terms of etching rate and etching directivity, in the sequence of multiple etching steps in patterning the dummy electrode layer 144. Various etching parameters can be tuned to strengthen the first RIE step 150*a*, such as etchant composition, etching temperature, etching solution concentration, etching time, etching pressure, source RF power, bias RF voltage, etchant flow rate, other suitable etching parameters, or combinations thereof. In some embodiments, the etchant may be a plasma containing a sulfur-containing compound, such as sulfur dioxide ($SO_2$) mixed with an inert gas selected from He, Ar, Xe, Kr, Ne, and combinations thereof. In a particular example, the first RIE step 150*a* is applied with a $SO_2$/He flow rate between 0 and about 500 sccm, under a gas pressure between 0 and about 60 mtorr, with a source RF power between about 200 and about 600 Watts, with a bias RF voltage between about 300 V and about 800 V, at a frequency between about 12 MHz and about 14 MHZ, and at a temperature between about 50° C. and about 60° C.

As the strongest one in the sequence of multiple etching steps, the first RIE step 150*a* produces a substantially vertical sidewall at the top portion of the patterned dummy electrode layer 144, denoted as the top sidewall 144T. The first RIE step 150*a* also recesses the top surface of the dummy electrode layer 144 in a fast rate, reducing the manufacturing time and increasing the product throughput. The first RIE step 150*a* may be a timed etch that is intended to stop at a distance (denoted as ΔH) from the fin-top surface of the fins 122. The distance ΔH allows a process window for the etching process to transit to a subsequent weaker etching step. The distance ΔH also protects the fin top from being damaged in a strong plasma etching. In some embodiments, the distance ΔH ranges from about 10 nm to about 20 nm. This range is not arbitrary. If the distance ΔH is smaller than 10 nm, the process window for the transition of etching strength may be too small and the fin top may be damaged. If the distance ΔH is larger than 20 nm, the sidewall of the patterned dummy electrode 144 may start tapering too early and cause protrusion into adjacent dummy gate stack at the gate bottom (i.e., device-level metal shorting).

Figure 10:
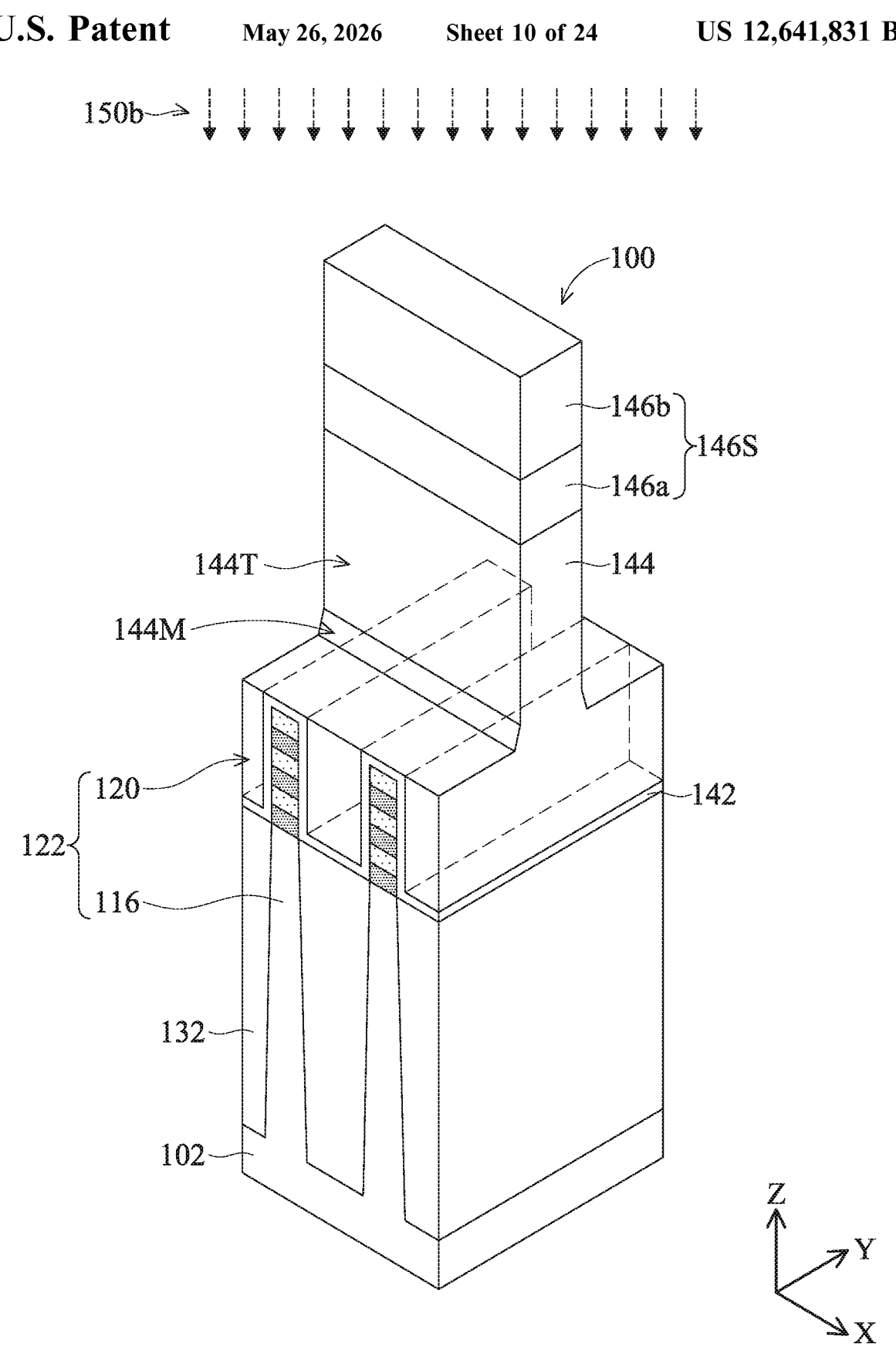

Referring to FIGS. 1 and 10, at operation 28, the method 10 etches a middle portion of the dummy electrode layer 144 with an etching step that is weaker than the previous one applied at operation 26. Under the weaker etching step, the sidewall of the patterned dummy electrode layer 144 starts to taper. In some embodiments, operation 28 includes a plasma etching process. In furtherance of the embodiments, operation 28 includes a second reactive ion etch (RIE) step 150*b*. The second RIE step 150*b* is weaker than the first RIE step 150*a*, in terms of etching rate and etching directivity.

In some embodiments, the second RIE step 150*b* has the same etchant, flow rate, gas pressure, and temperature as the first RIE step 150*a*, but with a lower source RF power and a lower bias RF voltage. In furtherance of the embodiments, the source RF power and the bias RF voltage may be reduced by about half during the transition from the first RIE step 150*a* to the second RIE step 150*b*. In a particular example, the second RIE step 150*b* is applied with a $SO_2$/He flow rate between 0 and about 500 sccm, under a gas pressure between 0 and about 60 mtorr, a source RF power between about 100 and about 300 Watts, a bias RF voltage between about 150 V and about 400 V, at a frequency between about 12 MHz and about 14 MHZ, and at a temperature between about 50° C. and about 60° C.

The second RIE step 150*b* may be a timed etch that is intended to stop when the fin top is exposed or about to expose (i.e., ΔH≈0). The weaker second RIE step 150*b* creates a middle portion of the sidewall (denoted as 144M) of the patterned dummy electrode layer 144 that starts tapering away from the top portion 144T.

Figure 11:
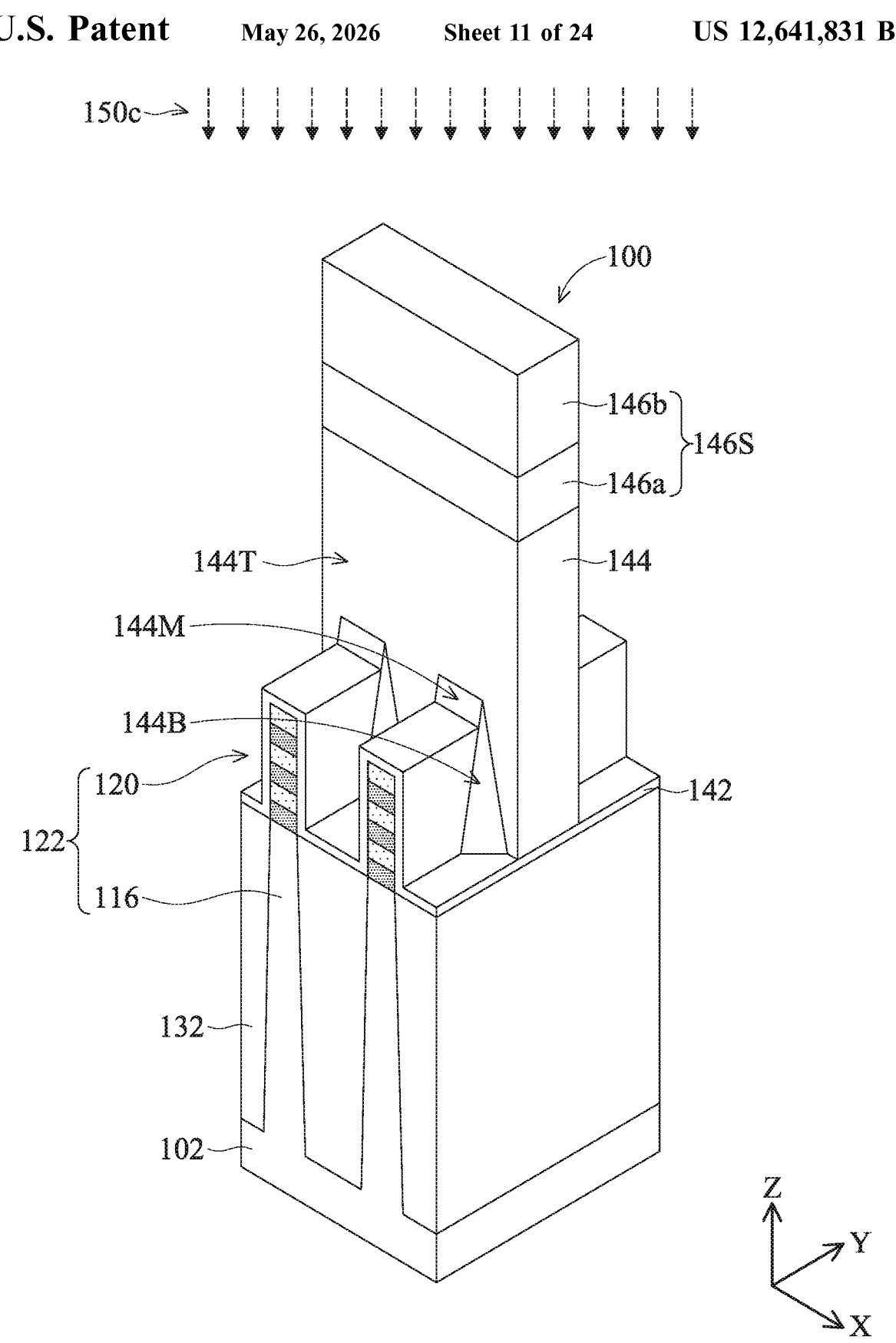

Referring to FIGS. 1 and 11, at operation 30, the method 10 etches a bottom portion of the dummy electrode layer 144 under the fin top with an etching step that is even weaker than the previous one applied at operation 28. Under the even weaker etching step, the sidewall of the patterned dummy electrode layer 144 continues to taper. In some embodiments, operation 30 includes a plasma etching process. In furtherance of the embodiments, operation 30 includes a third reactive ion etch (RIE) step 150*c*. The third RIE step 150*c* is weaker than the first RIE step 150*a* and the second RIE step 150*b*, in terms of etching rate and etching directivity. The even weaker third RIE step 150*c* creates a bottom portion of the sidewall (denoted as 144B) of the patterned dummy electrode layer 144 that further tapers away from the middle portion 144M.

In some embodiments, the third RIE step 150*c* has the same etchant, flow rate, gas pressure, and temperature as the second RIE step 150*b*, but with further reduced source RF power and bias RF voltage. In furtherance of the embodiments, the source RF power and the bias RF voltage are reduced by about half in the transition from the second RIE step 150*b* to the third RIE step 150*c*. In a particular example, the third RIE step 150*c* is applied with a $SO_2$/He flow rate between 0 and about 500 sccm, under a gas pressure between 0 and about 60 mtorr, a source RF power between about 50 and about 150 Watts, a bias RF voltage between about 75 V and about 200 V, at a frequency between about 12 MHz and about 14 MHZ, and at a temperature between about 50° C. and about 60° C.

In some embodiments, the third RIE step 150*c* uses a different etchant from the first and second RIE steps, such as a plasma containing a mixture of $CF_4$ and $Cl_2$ (i.e., $CF_4$/$Cl_2$ plasma) other than a sulfur-containing compound. Further, the third RIE step 150*c* may intentionally introduce etchants that may create polymer as a byproduct, such as a fluorine containing etchant mixed with a nitrogen containing carrier gas. The byproduct polymer may be formed, among other places, on the bottom portion 144B of the sidewall. Polymer can slow down the etching of the recessed dummy electrode layer 144. As a comparison, the first RIE step 150*a* and the second RIE step 150*b* may be free of the byproduct polymer.

As a result, the third RIE step 150*c* has the weakest etching strength in the series of the multiple etching steps.

Figure 12:
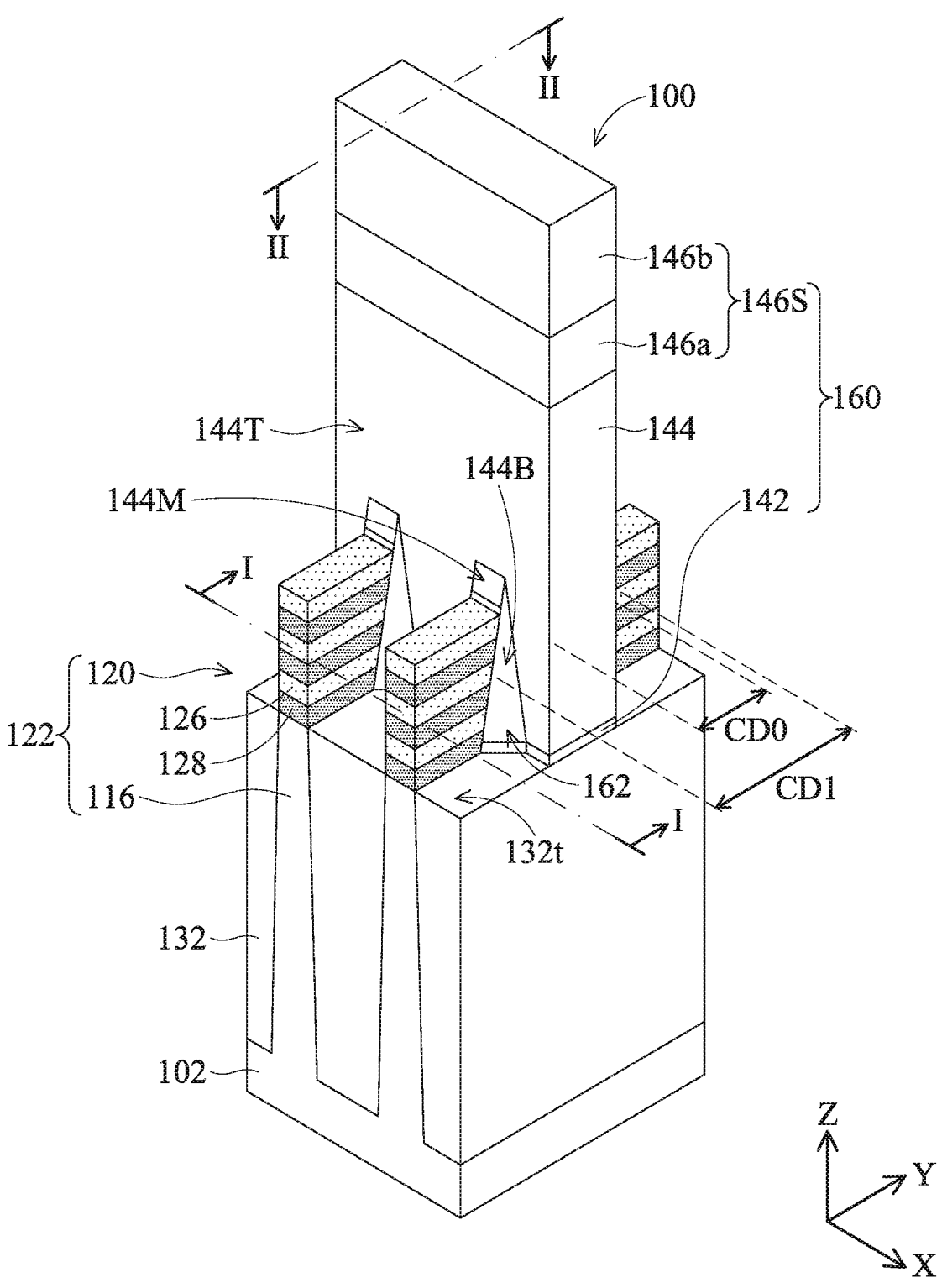

The third RIE step 150*c* exposes the top surface of the dummy dielectric layer 142. The uncovered portions of the dummy dielectric layer 142 may be further removed in a separate selective etching process. In some embodiments, the third RIE step 150*c* further removes uncovered portions of the dummy dielectric layer 142 and exposes the top surface of the isolation regions 132. A cleaning process may be applied to remove the byproduct polymer, if any, from the device 100. The resultant structure is shown in FIG. 12. The patterned dummy dielectric layer 142, the patterned dummy electrode layer 144, and the hard mask strip 146S are collectively referred to as the dummy gate stack 160. The patterned dummy dielectric layer 142 is also referred to as the dummy gate dielectric 142. The patterned dummy electrode layer 144 is also referred to as the dummy gate electrode 144.

Still referring to FIG. 12, the multiple RIE steps 150*a*-*c* create a protruding corner at the intersection of the dummy gate stack 160 and the underneath protruding fins 122. The protruding corner starts at the middle portion 144M of the sidewall of the dummy gate stack 160, continues to the bottom portion 144B, and stops at the top surface of the isolation regions 132. At the protruding corner, the gate CD (denoted as CD1) is larger than the gate CD at locations away from the protruding corner (denoted as CD0). Since the protruding corner starts above the fin top, the channel region (starting from the topmost channel layer 126 and down) benefits from a relatively larger gate CD. Yet, in some alternative embodiments, the protruding corner may start under the fin top (i.e., there is no 144M above the fin top), depending on particular etching parameters of the above anisotropic etching processes (e.g., the second RIE step 150*b* may be optionally skipped). As a result, the topmost channel layer 126 may still be engaged by a gate CD that is CD0, while the middle channel layer(s) 126 and the bottommost channel layer 126 are engaged by gate CDs that are all larger than CD0.

Figure 13:
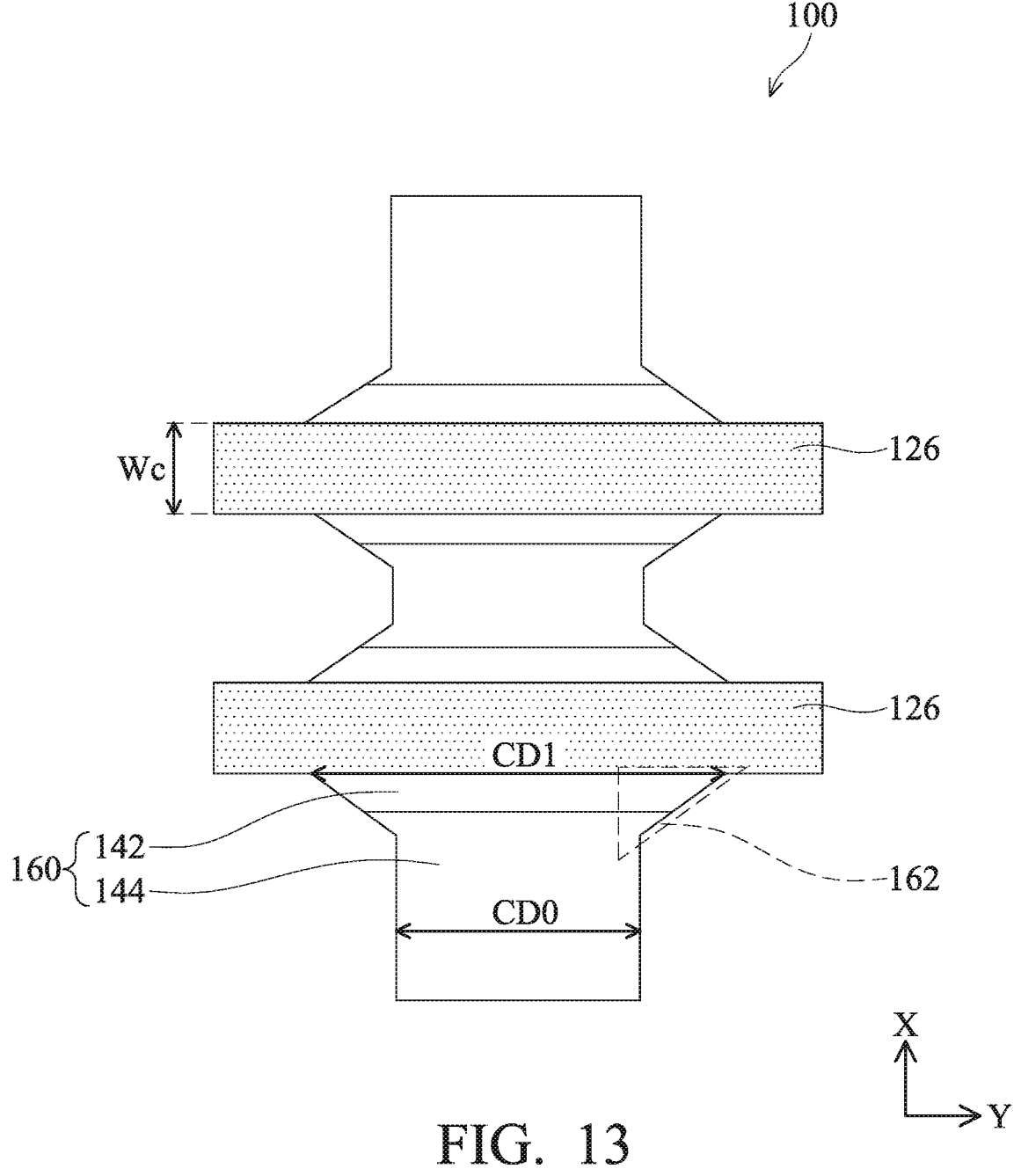
FIGS. 13, 15, 23, and 24 illustrate cross-sectional views in a horizontal plane cutting through a semiconductor structure during a fabrication process according to the method of FIG. 1, in accordance with some embodiments of the present disclosure.

A cross-sectional view of the structure shown in FIG. 12 is illustrated in FIG. 13. The cross-sectional view is obtained from the horizontal plane containing line I-I in FIG. 12. The horizontal plane is cutting through one of the channel layers 126 (e.g., a topmost channel layer 126, one of the middle channel layers 126, or a bottommost channel layer 126). As shown in FIG. 13, one of dummy gate stacks 160 is illustrated. A gate length (measured along a direction perpendicular to the lengthwise direction of a gate stack; i.e., along Y-direction in FIG. 13) is denoted as gate critical dimension (CD). Due to the gate patterning process discussed above, the portions of dummy gate stack 160 intersecting the fins 122 may be wider than other portions distant from the fins 122. The widening in the portions of dummy gate stack 160 intersecting the fins 122 is also referred to as "footing effect", and the widening portions are referred to as footing regions (or protruding corner), as marked by portions 162. Accordingly, a gate CD measured at different portions of dummy gate stack 160 may have different values. FIG. 13 illustrates gate CDs measured at two different regions of the dummy gate stack 160, denoted as CD0 and CD1. CD0 is measured at a region that is away from the fin, which is referred to as an "outer-fin" region. CD1 is measured in proximity to an edge (sidewall) of the protruding fin 122 (or channel layer 126), which is referred to as an "on-fin" region. The term "in proximity to" refers to a distance less than about 1 nm or right on an edge of a protruding fin.

In some embodiments, CD0 ranges from about 10 nm to about 12 nm, the width of the protruding corner 162 ((CD1−CD0)/2) measured along Y-direction ranges from about 0.8 nm to about 2.8 nm, and the width (denoted as Wc) of the channel layer 126 measured along X-direction ranges from about 20 nm to about 25 nm.

Along the Z-direction, by measuring gate CDs at different heights of the dummy gate stack 160, a gate CD profile of the dummy gate stack 160 can be acquired. In various embodiments, gate CDs can be measured by state of art metrologies, such as cross-section scanning electron microscopy (SEM), Transmission electron microscopy (TEM), critical dimension scanning electron microscopy (CD-SEM). Others such as optical critical dimension (OCD), atomic force metrology (AFM), and critical dimension-atomic force metrology (CD-AFM) can also be used for measuring gate CDs.

Figure 14:
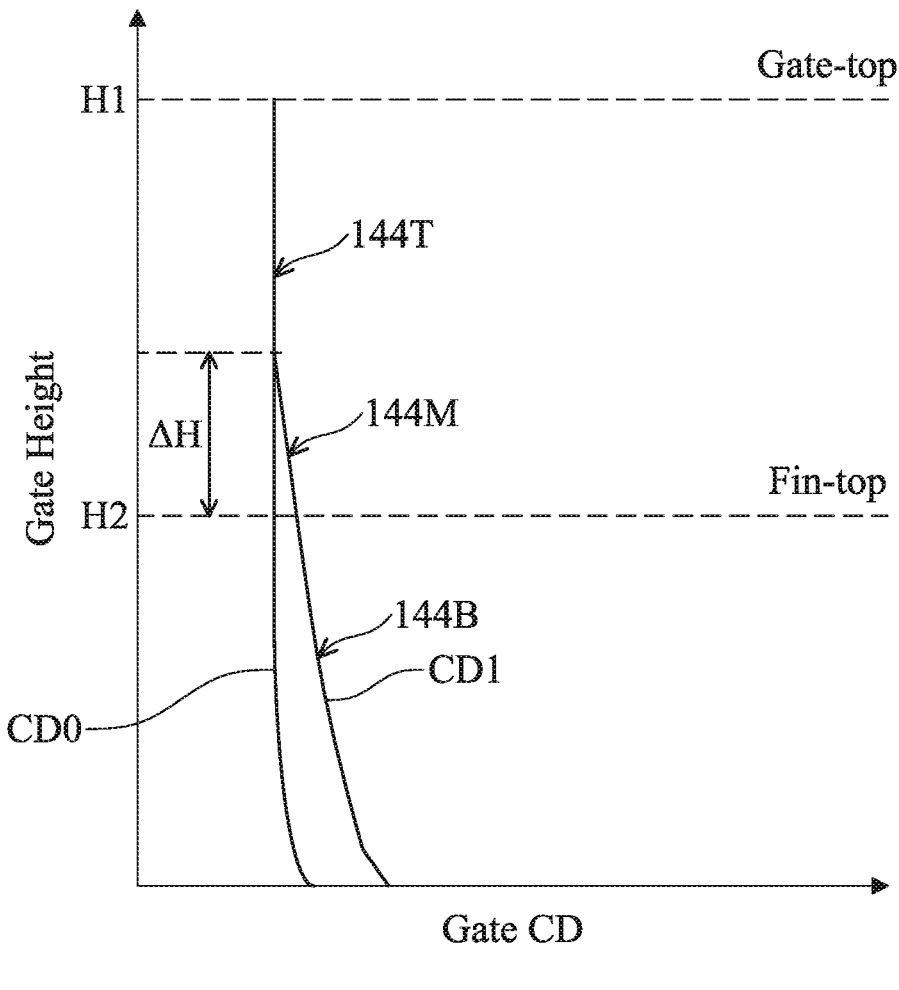
FIG. 14 illustrates a gate critical dimension (CD) profile versus a gate height, in accordance with some embodiments of the present disclosure.

FIG. 14 illustrates a diagram of an exemplary gate CD profile measured at different regions of the dummy gate stack 160. The diagram in FIG. 14 is general to both a dummy gate stack and a replacement gate stack (e.g., a metal gate stack), as the replacement gate stack may inherit the shape of the dummy gate stack. The horizontal-axis of the diagram represents gate CD value. The vertical-axis of the diagram represents a height of a gate stack with reference to a top surface 132t of the isolation regions 132. The overall height of a gate stack (H1) and overall height of the protruding portion of the fin 122 (H2) are also marked on the vertical-axis for references. Particularly, in the diagram, line "CD0" represents gate CDs measured at an "outer-fin" region of the gate stack, and line "CD1" represents gate CDs measured at an "on-fin" region of the gate stack.

Still referring to FIG. 14, the gate CDs measured in "outer-fin" and "on-fin" regions have substantially the same value (i.e., CD0=CD1) when it is above a height of ΔH above the fin top of a protruding fin, which corresponds to the vertical top portion 144T of a gate stack sidewall. As discussed above. ΔH may range from about 10 nm to about 20 nm, in some embodiments. Along the line "CD0", the gate CD remains substantially the same as due to the vertical sidewalls of the gate stack in the "outer-fin" region. The line "CD0" may slightly taper as close to the top surface 132t of the isolation regions 132, which is mainly due to etching residues remaining in corner regions of a gate stack. Along the line "CD1", the gate CD starts to taper under the height of ΔH above the fin top of a protruding fin, which corresponds to the tapering middle portion 144M of a gate stack sidewall, and further taper out under the fin top (H2) of the protruding fin 122, which corresponds to the tapering bottom portion 144B of a gate stack sidewall. The larger gate CD in the "on-fin" region provides stronger gate control capability. Further, closer to the bottom of the channel region, the gate CD in the "on-fin" region becomes larger, which effectively combats the SCEs and DIBL. In some embodiments, DIBL may be suppressed for about 10%.

Figure 15:
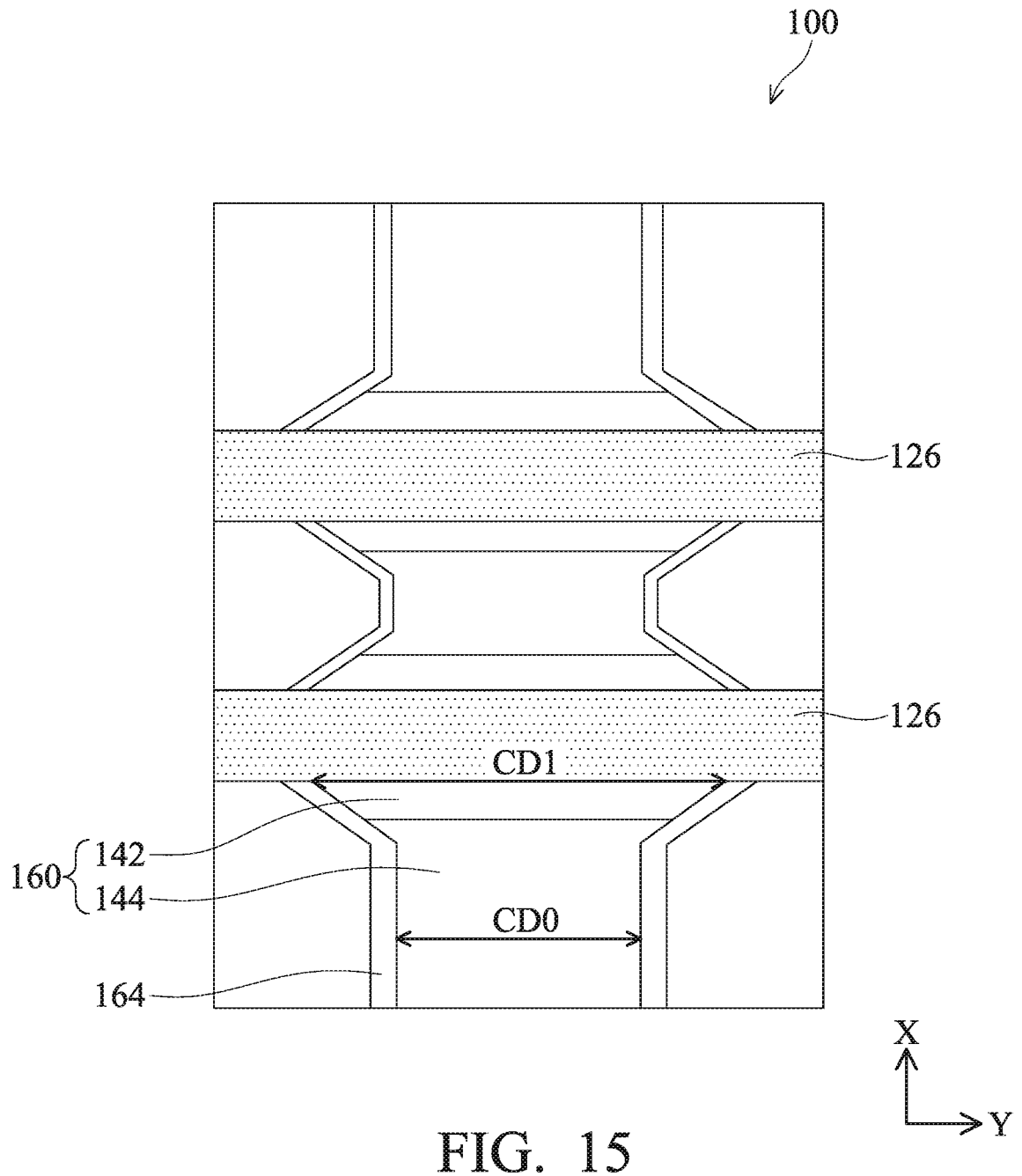

Referring to FIGS. 1 and 15, at operation 32, the method 10 forms gate spacers 164 conformally on sidewalls of the dummy gate stack 160. FIG. 15 is a cross-sectional view obtained from the horizontal plane containing line I-I in FIG. 12. The gate spacers 164 may follow the profile of the sidewalls of dummy gate stack 160, and hence cover the protruding corner of the dummy gate stack 160. In some embodiments, the gate spacers 164 are formed of dielectric materials, such as silicon oxide, silicon nitride, carbonized silicon nitride (SiCN), SiCON, or a combination thereof. A thickness of the gate spacers 164 ranges from about 1 nm to about 5 nm in some embodiments. Although the gate spacers 164 illustrated in FIG. 15 is a single-layered structure, the embodiments of the present disclosure are not limited thereto. In other embodiments, the gate spacers 164 may be a multi-layered structure. For example, the gate spacers 164 may include a silicon oxide layer and a silicon nitride layer disposed on the silicon oxide layer.

Figure 16:
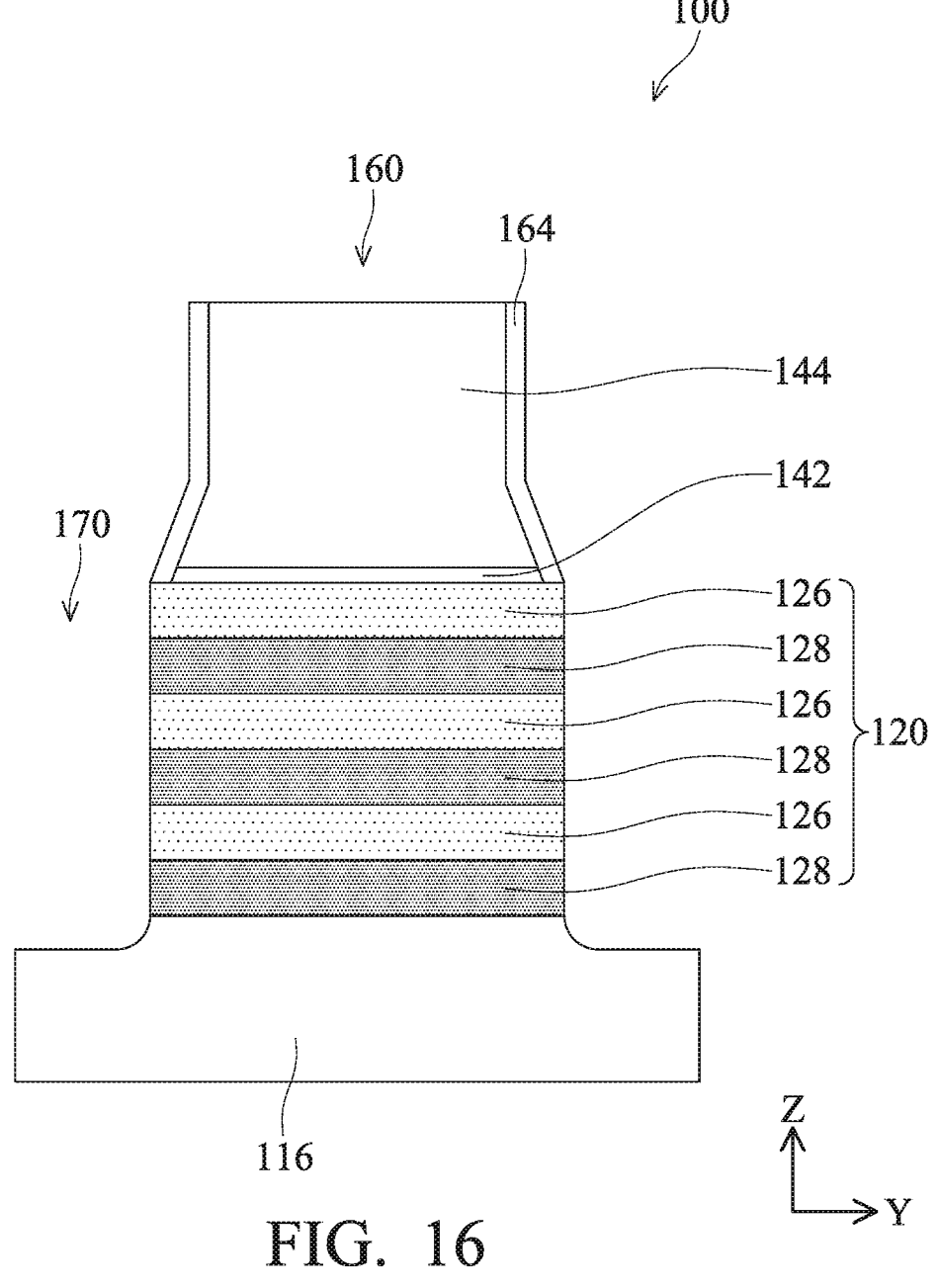
FIGS. 16, 17, 18, 20, 21, and 22 illustrate cross-sectional views in a vertical plane cutting through a semiconductor structure during a fabrication process according to the method of FIG. 1, in accordance with some embodiments of the present disclosure.

Referring to FIGS. 1 and 16, at operation 34, the method 10 removes the end portions of the nanosheet stacks 120 to form recesses 170. FIG. 16 is a cross-sectional view obtained from the vertical plane containing line II-II in FIG. 12. Herein, the recesses 170 may be referred to as source/drain (S/D) recesses 170. In some embodiments, the end portions of the nanosheet stacks 120 may be removed by an anisotropic etching process, an isotropic etching process, or a combination thereof. In some embodiments, the S/D recesses 170 further extend into the fin bases 116 and are lower than the top surfaces 132t of the isolation regions 132. In other words, the end portions of the nanosheet stacks 120 are entirely removed and top portions of the fin bases 116 are further removed.

Figure 17:
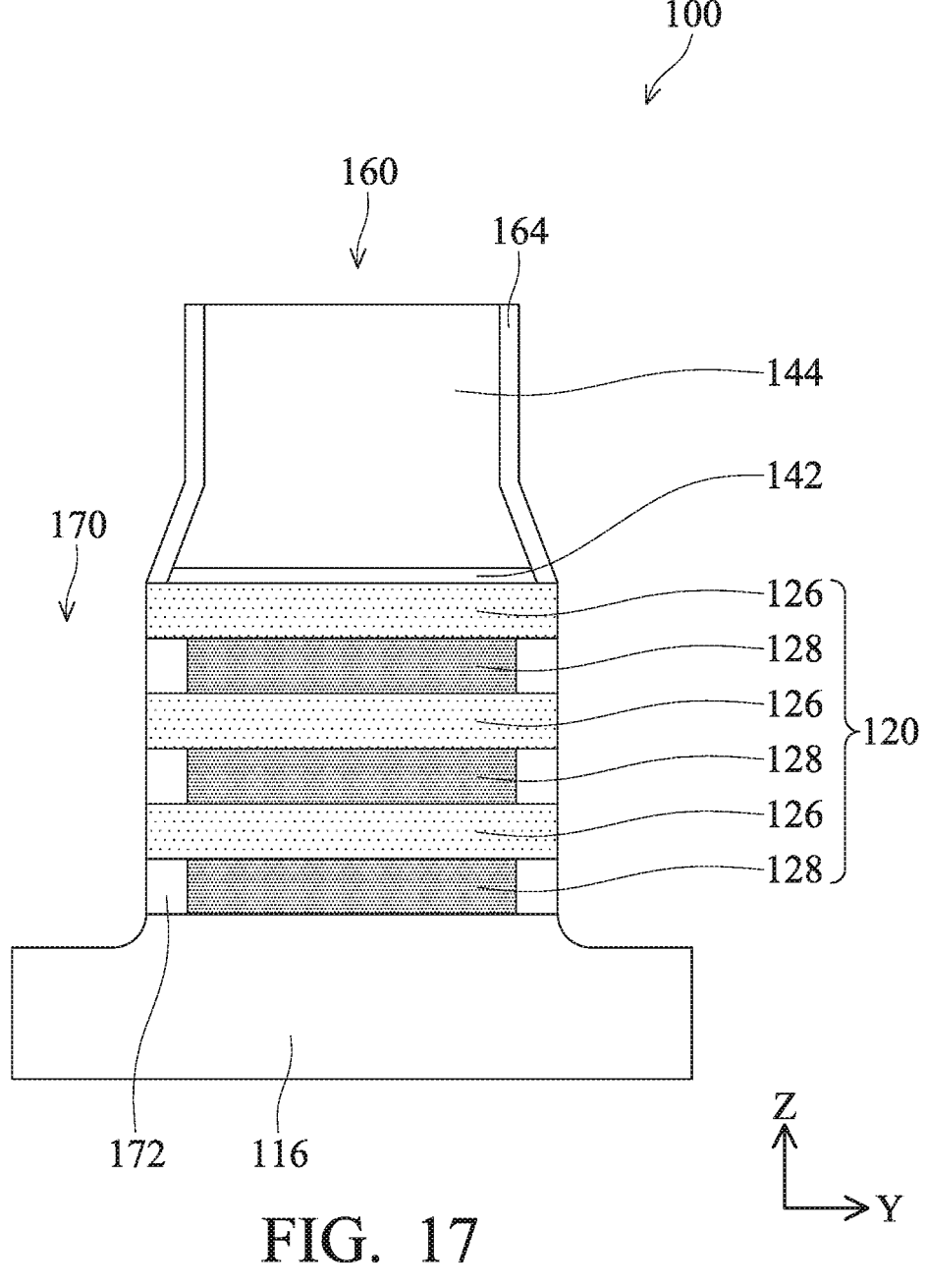

Referring to FIGS. 1 and 17, at operation 36, the method 10 forms inner spacers 172 at opposite end portions of the sacrificial layers 128. In some embodiments, opposite end portions of the sacrificial layers 128 as exposed in the source/drain trenches 170 are selectively and partially recessed to form inner spacer recesses (not shown), while the channel layers 126 are substantially unetched. In an embodiment where the channel layers 126 consist essentially of silicon (Si) and the sacrificial layers 128 consist essentially of silicon germanium (SiGe), the selective and partial recess of the sacrificial layers 128 may include a SiGe oxidation process followed by a SiGe oxide removal. The SiGe oxidation process may include use of ozone ($O_3$). In some other embodiments, the selective recess may be a selective isotropic etching process (e.g., a selective dry etching process or a selective wet etching process), and the extent at which the sacrificial layers 128 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. After the formation of the inner spacer recesses, an inner spacer material layer is deposited over the device 100, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacers 164 and sidewalls of the channel layers 126, thereby forming the inner spacers 172. In some embodiments, the etch back process may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas (e.g., $CF_3I$), other suitable gases and/or plasmas, and/or combinations thereof.

Figure 18:
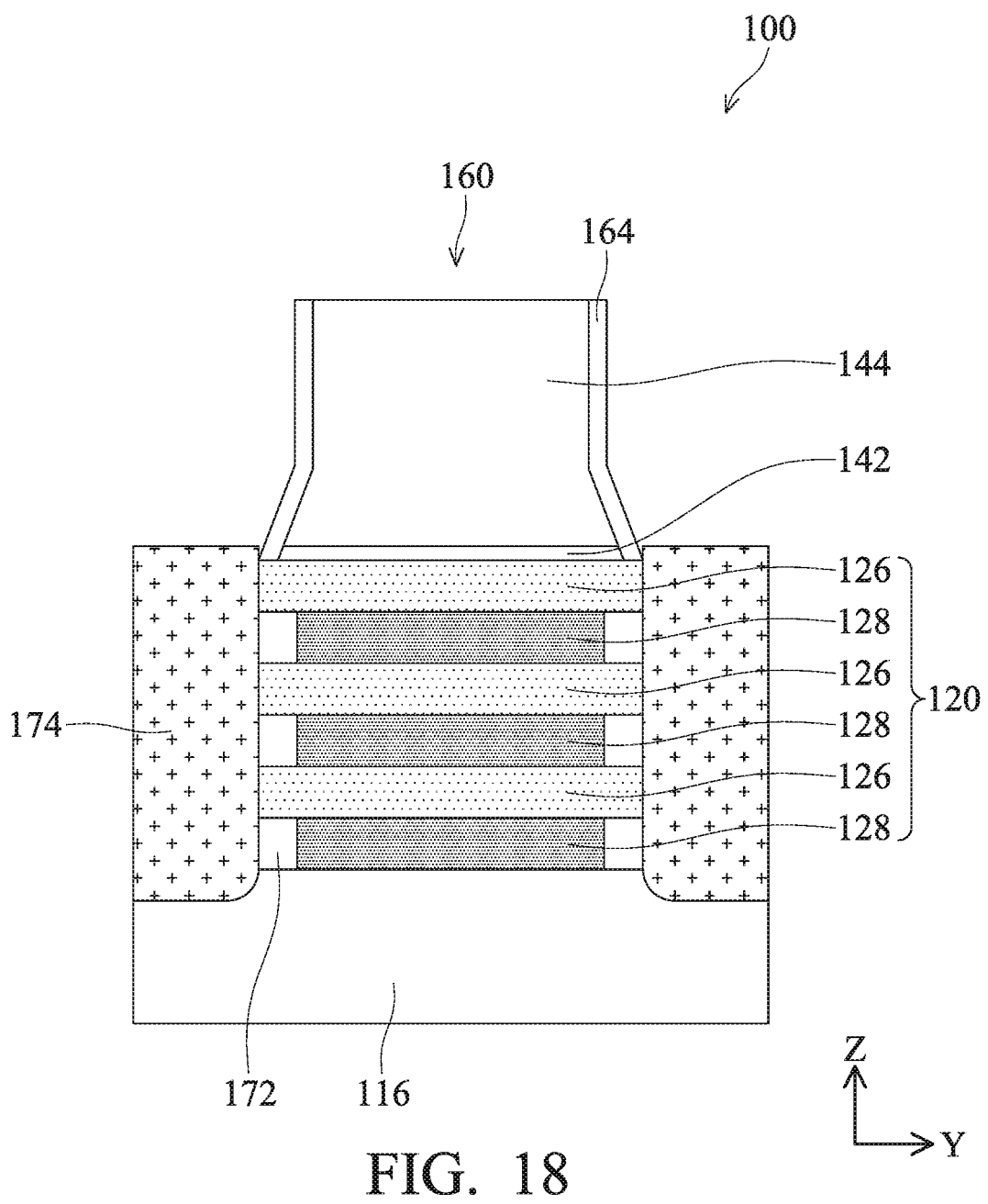

Referring to FIGS. 1 and 18, at operation 38, the method 10 epitaxially grown source/drain (S/D) features 174 from the S/D recesses 170. In the case, the S/D features 174 includes a source disposed at one side of the dummy gate stack 160 and a drain disposed at another side of the dummy gate stack 160. The source covers an end of the fin bases 116, and the drain covers another end of the fin bases 116. The S/D features 174 are abutted and electrically connected to the channel layers 126, while the S/D features 174 are electrically isolated from the sacrificial layers 128 by the inner spacers 172. In some embodiments, the S/D features 174 extend beyond the top surface of the nanosheet stacks 120. However, the embodiments of the present disclosure are not limited thereto, in other embodiments, the top surface of the S/D features 174 is substantially aligned with the top surface of the nanosheet stacks 120.

The S/D features 174 include any acceptable material, such as appropriate for p-type transistors or n-type transistors. For example, the S/D features 174 may include SiGe, SiGeB, Ge, GeSn, or the like, which is appropriate for p-type transistors. In some alternative embodiments, the S/D features 174 may include silicon, SiC, SiCP, SiP, or the like, which is appropriate for n-type transistors. In some embodiments, the S/D features 174 are formed by MOCVD, MBE, ALD, or the like. The S/D features 174 may comprise one or more semiconductor material layers. For example, the S/D features 174 may comprise a bottom semiconductor material layer, a middle semiconductor material layer, and a capping semiconductor material layer. Any number of semiconductor material layers may be used for the S/D features 174. Each of the semiconductor material layers may be formed of different semiconductor materials and may be doped to different dopant concentrations. In embodiments in which the S/D features 174 comprise three semiconductor material layers, the bottom semiconductor material layer may be deposited, the middle semiconductor material layer may be deposited over the bottom semiconductor material layer, and the capping semiconductor material layer may be deposited over the middle semiconductor material layer.

In some embodiments, the S/D features 174 are doped with a conductive dopant. For example, the S/D features 174, such as SiGe, may be epitaxial-grown with a p-type dopant for straining a p-type transistor. That is, the S/D features 174 are doped with the p-type dopant to be the source and the drain of the p-type transistor. The p-type dopant includes boron or $BF_2$, and the S/D features 174 may be epitaxial-grown by LPCVD process with in-situ doping. As discussed above, the S/D features 174 may be epitaxially-grown with multiple layers differed in dopant concentrations, such as a bottom layer of SiGe:B with Ge atomic percentage from about 45% to 55% and a boron concentration of about $1 \times 10^{21}$/cm$^3$ to about $2 \times 10^{21}$/cm$^3$, a middle layer of SiGe:B with Ge atomic percentage from about 45% to 60% and a boron concentration of about $8 \times 10^{20}$/cm$^3$ to about $3 \times 10^{21}$/cm$^3$, and a capping layer of SiGe:B with Ge atomic percentage from about 25% to 45% and a boron concentration of about $1 \times 10^{20}$/cm$^3$ to about $8 \times 10^{20}$/cm$^3$. In some alternative embodiments, the S/D features 174, such as SiC. SiP, a combination of SiC/SiP, or SiCP is epitaxial-grown with an n-type dopant for straining an n-type transistor. That is, the S/D features 174 are doped with the n-type dopant to be the source and the drain of the n-type transistor. The n-type dopant includes arsenic and/or phosphorus, and the S/D features 174 may be epitaxial-grown by LPCVD process with in-situ doping. In some embodiments, the S/D features 174 are epitaxially-grown with multiple layers differed in dopant concentrations, such as a bottom layer of Si:P with a phosphorus concentration of about $1 \times 10^{21}$/cm$^3$ to about $2 \times 10^{21}$/cm$^3$, a middle layer of Si:P with a phosphorus concentration of about $1 \times 10^{21}$/cm$^3$ to about $4 \times 10^{21}$/cm$^3$, and a capping layer of Si:As with an arsenic concentration of about $1 \times 10^{20}$/cm$^3$ to about $1 \times 10^{21}$/cm$^3$.

Figure 19:
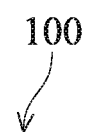

As a result of the epitaxial-grown process used to form the S/D features 174, the cross section of the S/D features 174 may have a diamond or pentagonal shape. However, the embodiments of the present disclosure are not limited thereto. In other embodiments, the cross section of the S/D features 174 also have a hexagonal shape, a pillar shape, or a bar shape. FIG. 19 depicts a perspective view of an exemplary resultant structure after the epitaxial-grown process is completed. As shown in FIG. 19, adjacent S/D features 174 are separated from each other after the epitaxial-grown process is completed. Alternatively, adjacent S/D features 174 may be merged.

Figure 20:
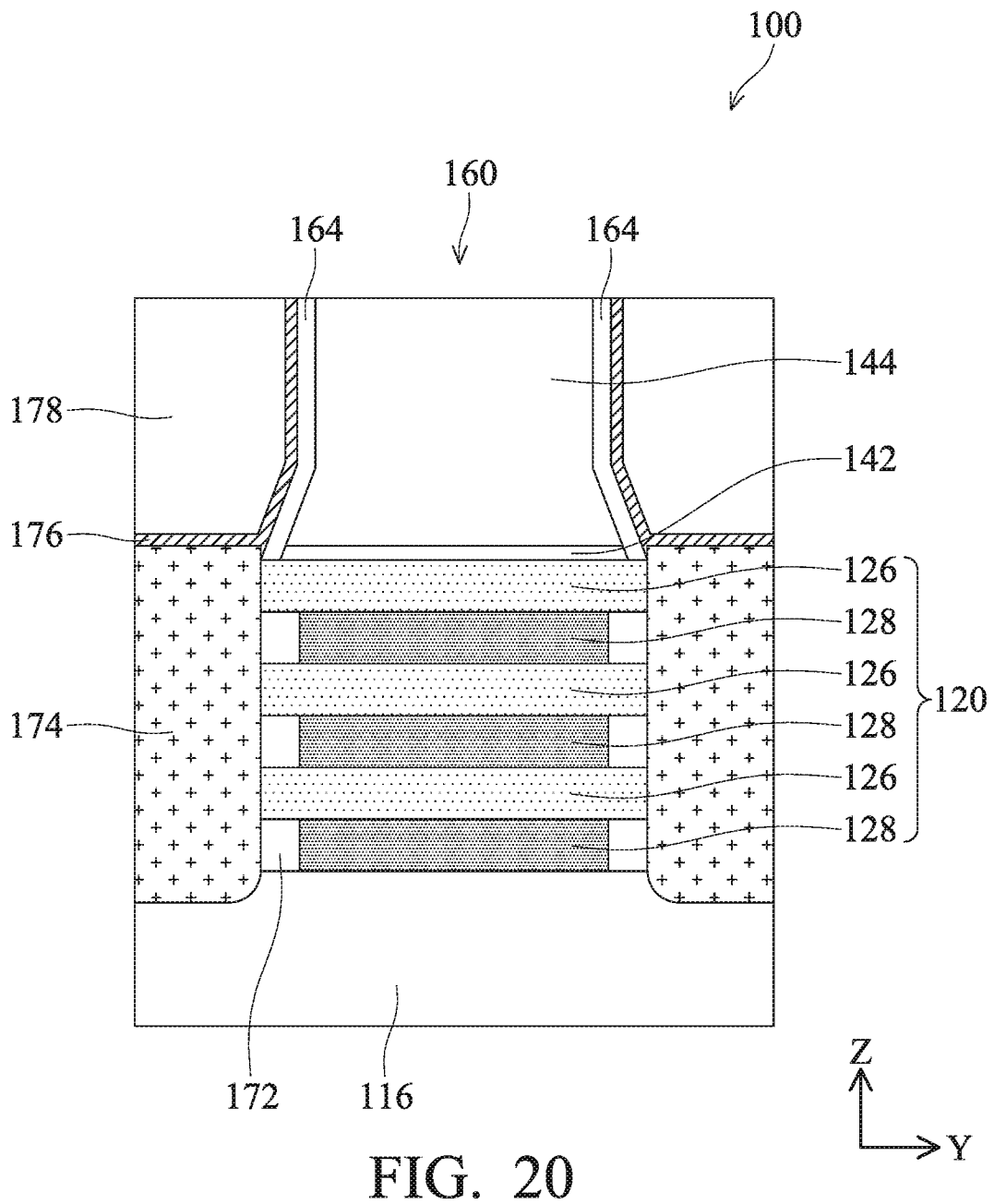

Referring to FIGS. 1 and 20, at operation 40, the method 10 forms an interlayer dielectric (ILD) layer 178 over the device 100. FIG. 20 is a cross-sectional view obtained from the vertical plane containing line II-II in FIG. 19. A contact etch stop layer (CESL) 176 may also be formed between the S/D features 174 and the ILD layer 178. In some embodiments, the CESL 176 conformally covers the S/D features 174 and the sidewalls of the outer sidewalls of the gate spacers 164. The CESL 176 may include silicon nitride, silicon oxynitride, silicon nitride with oxygen (O) or carbon (C) elements, and/or other materials; and may be formed by CVD, PVD (physical vapor deposition), ALD, or other suitable methods.

The ILD layer 178 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 178 includes low-k dielectric materials. Examples of low-k dielectric materials include BLACK DIAMOND® (Applied Materials of Santa Clara, Calif.), Xerogel, Acrogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 178 include one or more dielectric materials and/or one or more dielectric layers. In some embodiments, the ILD layer 178 is formed to a suitable thickness by FCVD, CVD, HDPCVD, SACVD, spin-on, sputtering, or other suitable methods. For example, an interlayer dielectric material layer is initially formed to cover the isolation regions 132, the dummy gate stack 160, and the gate spacers 164. Subsequently, a thickness of the interlayer dielectric material layer is reduced until the dummy gate electrode 144 is exposed, so as to form the ILD layer 178. The process of reducing the thickness of the interlayer dielectric material layer may be achieved by a chemical mechanical polishing (CMP) process, an etching process, or other suitable processes. In the case, the top surface of the ILD layer 178 may be coplanar with the top surface of the dummy gate electrode 144.

Figure 21:
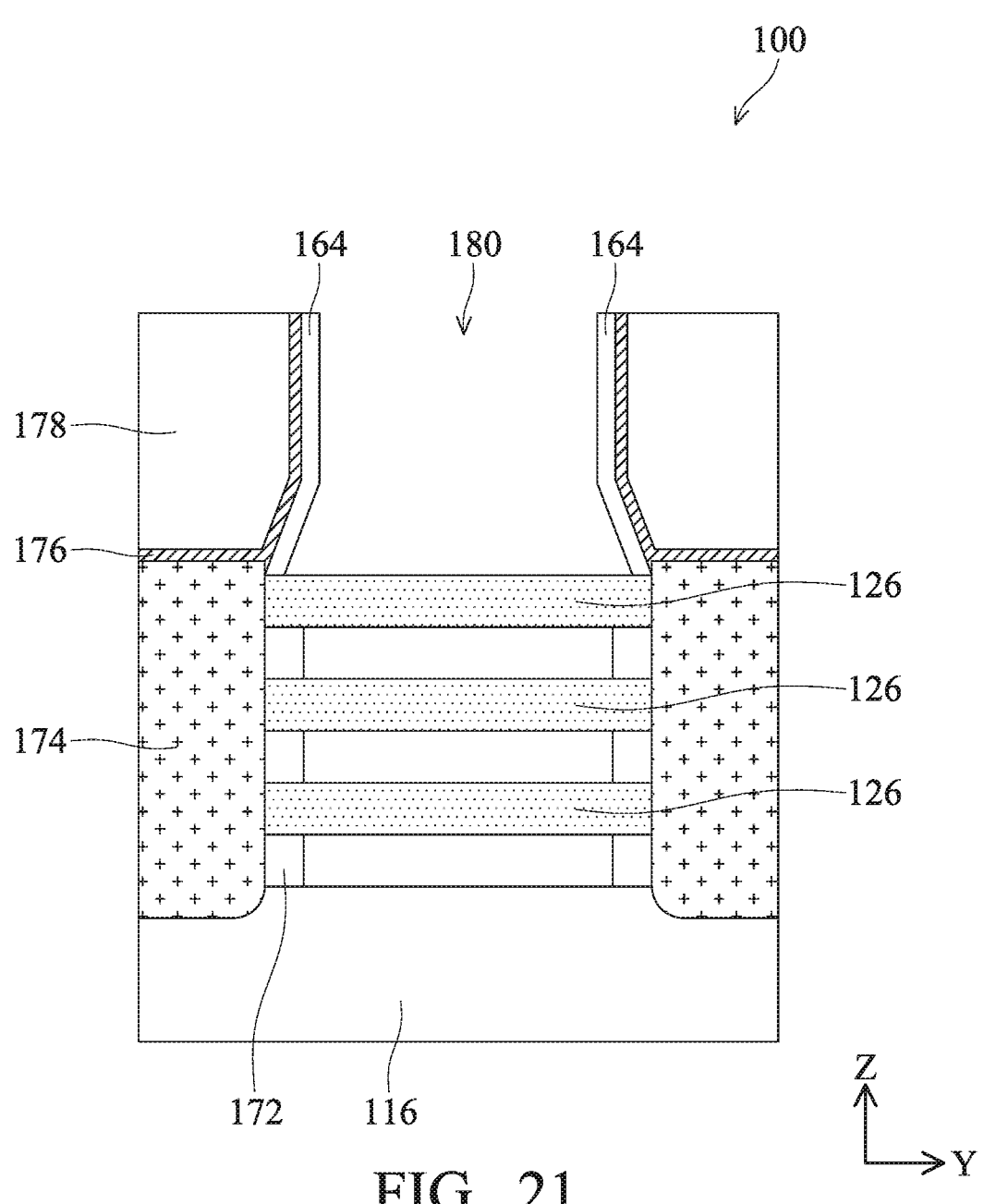

Referring to FIGS. 1 and 21, at operation 42, the method 10 removes the dummy gate stack 160 to form a gate trench 180. The CESL 176 and the ILD layer 178 may protect the S/D features 174 during removing the dummy gate stack 160. The dummy gate stack 160 may be removed by using plasma dry etching and/or wet etching. When the dummy gate electrode 144 is polysilicon and the ILD layer 178 is silicon oxide, a wet etchant such as a TMAH solution may be used to selectively remove the dummy gate electrode 144. The dummy gate dielectric 142 is thereafter removed by using another plasma dry etching and/or wet etching.

Also as shown in FIG. 21, an etching process is performed to remove the sacrificial layers 128. In the case, the sacrificial layers 128 may be completely removed to form a plurality of gaps between the channel layers 126. Accordingly, the channel layers 126 are separated from each other by the gaps. In addition, the bottommost channel layer 126 may also be separated from the fin bases 116 by the gap. As a result, the channel layers 126 are suspended. In the present embodiment, the channel layers 126 include silicon, and the sacrificial layers 128 include silicon germanium. The sacrificial layers 128 may be selectively removed by oxidizing the sacrificial layers 128 using a suitable oxidizer, such as ozone. Thereafter, the oxidized sacrificial layers 128 may be selectively removed from the gate trench 180. In some embodiments, the etching process includes a dry etching process to selectively remove the sacrificial layers 128, for example, by applying an HCl gas at a temperature of about 20° C. to about 300° C., or applying a gas mixture of $CF_4$, $SF_6$, and $CHF_3$. The opposite ends of the suspended channel layers 126 are connected to S/D features 174. The etching process may be referred to as channel layer (or channel member) releasing process.

Figure 22:
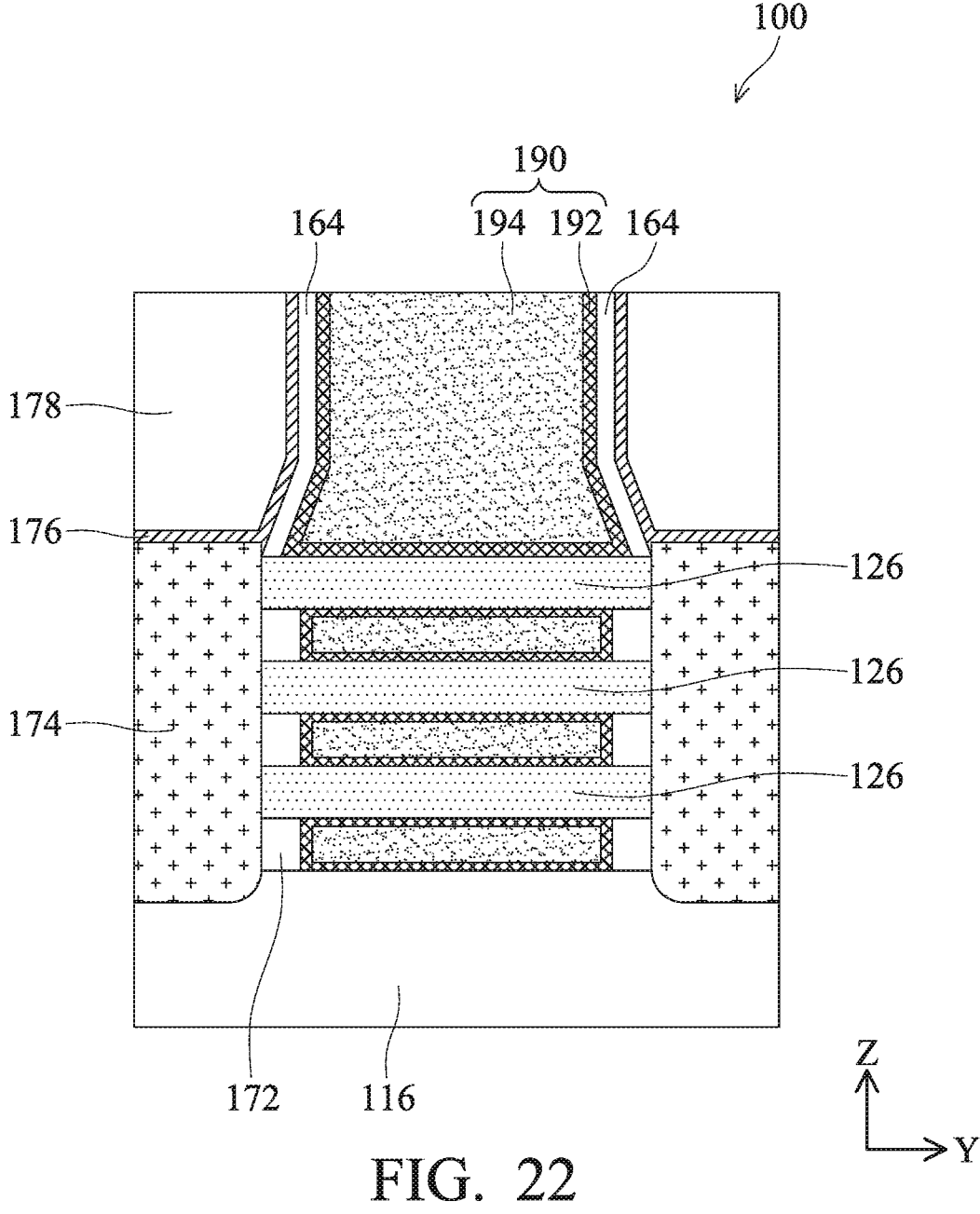
Figure 23:
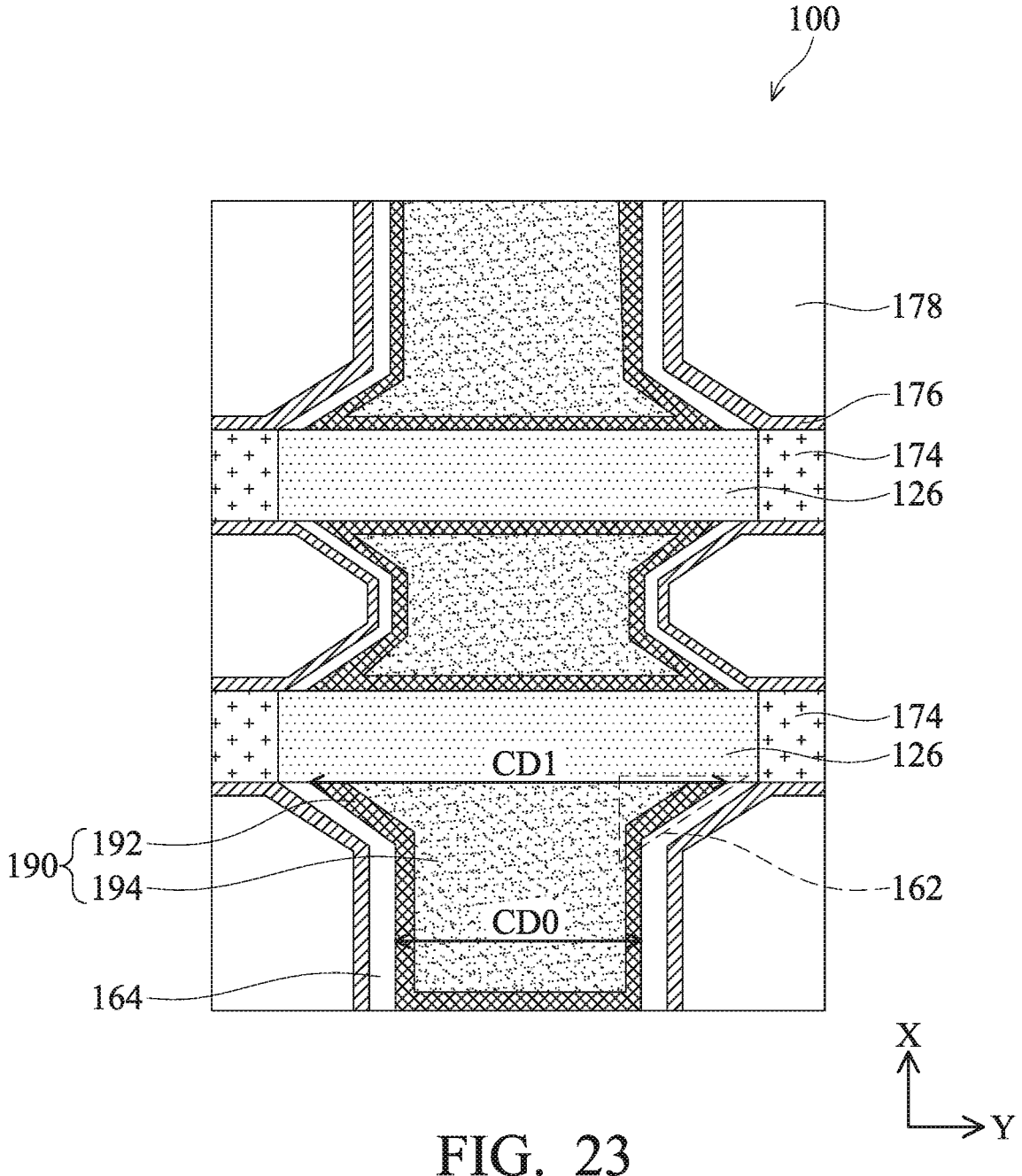

Referring to FIGS. 1 and 22-23, at operation 44, the method 10 forms a metal gate stack 190, such as a high-k metal gate stack, in the gate trench 180. FIG. 22 is a cross-sectional view obtained from the vertical plane containing line II-II in FIG. 19. FIG. 23 is a cross-sectional view obtained from the horizontal plane containing line I-I in FIG. 19. The horizontal plane is cutting through one of the channel layers 126 (e.g., a topmost channel layer 126, one of the middle channel layers 126, or a bottommost channel layer 126). The metal gate stack 190 includes a gate dielectric layer 192 and a gate electrode 194. The gate dielectric layer 192 wraps around the channel layers 126. In some embodiments, the gate dielectric layer 192 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, lanthanum oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 192 includes an interfacial layer (not shown) formed between the channel layers 126 and the high-k dielectric material. The gate dielectric layer 192 may be formed by CVD, ALD or any suitable method. In one embodiment, the gate dielectric layer 192 is formed by using a highly conformal deposition process, such as ALD in order to ensure the formation of a gate dielectric layer having a uniform thickness around each channel layers 126. A thickness of the gate dielectric layer 192 ranges from about 0.5 nm to about 3 nm in some embodiments.

The gate electrode 194 is formed on the gate dielectric layer 192 and then planarized by using, for example, a CMP process, until the top surface of the ILD layer 178 is revealed. The gate electrode 194 may include various conductive materials, such as polysilicon, aluminum, copper, titanium, tantalum, tungsten, cobalt, molybdenum, tantalum nitride, nickel silicide, cobalt silicide, TIN, WN, TiAl, TiAiN, TaCN, TaC, TaSiN, metal alloys, other suitable materials, and/or combinations thereof. The gate electrode 194 may include one or more layers of conductive materials, such as a work function metal (WFM) layer and a metal fill layer (not shown), and/or other suitable layer.

Figure 24:
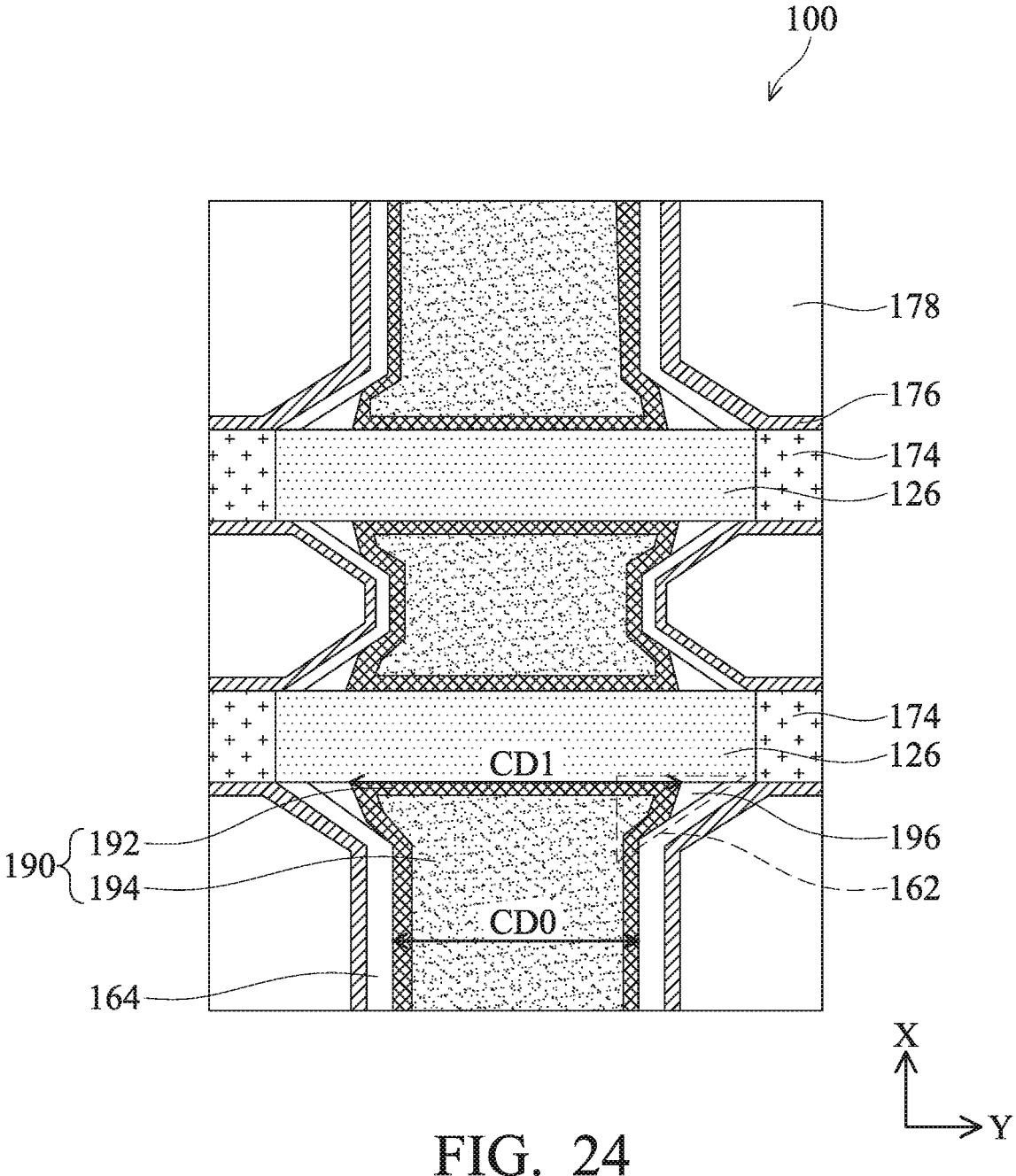

As shown in FIG. 23, the gate dielectric layer 192 and/or the gate electrode 194 may completely fill up the space in the protruding corner 162. In an alternative embodiment as depicted in FIG. 24, a void 196 may be sealed by the gate dielectric layer 192 in the protruding corner 162, which is due to the difficulty in filling a corner region in a high-aspect ratio gate trench. The void 196 may trap air or other ambient gas(es) applied during the manufacturing flow. Further, since it is more difficult to fill the corner region when it is closer to the bottom of a high-aspect ratio gate trench, the size of the void 196 in the cross-sectional view is becoming larger when the cross-sectional view is cutting through bottom ones of the channel layers 126. In one embodiment, the cross-sectional view cutting through the topmost channel layer 126 is free of the void 196, as depicted in FIG. 23, while the cross-sectional views cutting through underneath middle channel layers 126 (particularly, the bottommost channel layer 126) may have the void 196 showing up. Although the size of the void 196 may be increasing when it is approaching the gate bottom, the "on-fin" gate CD (CD1 in FIG. 14) is still increasing when it is approaching the gate bottom as shown in FIG. 14 due to the tapering gate sidewall. Instead of the void 196, in some embodiments, it is residue of the dummy gate dielectric 142 and/or the dummy gate electrode 144 remaining in the corner region of the protruding corner 162, which is due to the difficulty to remove the residue from a high-aspect ratio gate trench during a removal process.

Although not intended to be limiting, one or more embodiments of the present disclosure provide many benefits to a semiconductor device and the formation thereof. For example, embodiments of the present disclosure provide a simple and cost-effective system and methodology for gate formation without a significant reduction in production throughput. In the present disclosure, gate critical dimension measured near or on edges of a fin on which a gate stack is engaging is enlarged to provide better gate control. Furthermore, the workflow of gate formation can be easily integrated into existing semiconductor fabrication processes.

In one exemplary aspect, the present disclosure is directed to a method of forming a semiconductor structure. The method includes providing a structure that includes a substrate and a fin protruding from the substrate, depositing a dummy material stack over the fin, patterning a top portion of the dummy material stack in a first etching process, the first etching process having a first etching strength, patterning a middle portion of the dummy material stack in a second etching process, the second etching process having a second etching strength that is weaker than the first etching strength, patterning a bottom portion of the dummy material stack in a third etching process, thereby forming a dummy gate stack, the third etching process having a third etching strength that is weaker than the second etching strength, and replacing the dummy gate stack with a metal gate stack. In some embodiments, the first etching process produces a substantially vertical sidewall of the top portion of the dummy material stack. In some embodiments, the second etching process produces a tapering sidewall of the middle portion of the dummy material stack. In some embodiments, the third etching process produces a tapering sidewall of the bottom portion of the dummy material stack. In some embodiments, the third etching process produces a polymer byproduct deposited on a tapering sidewall of the bottom portion of the dummy material stack. In some embodiments, the first and second etching processes are free of producing the polymer byproduct. In some embodiments, the first etching process stops at a height above a top surface of the fin. In some embodiments, the height above the top surface of the fin ranges from about 10 nm to about 20 nm. In some embodiments, the second etching process stops at the top surface of the fin. In some embodiments, the metal gate stack has a first gate critical dimension (CD) measured at an edge of the fin and a second gate CD measured at a location distant from the fin, and the first gate CD is larger than the second gate CD.

In another exemplary aspect, the present disclosure is directed to a method of forming a semiconductor device. The method includes forming a fin protruding from a substrate, depositing a dummy electrode layer over the fin, etching a top portion of the dummy electrode layer in a first etching process to form a first sidewall above a top surface of the fin, etching a bottom portion of the dummy electrode layer in a second etching process to form a second sidewall under the top surface of the fin, the first and second etching processes using different etching recipes, and the second sidewall being tapered from the first sidewall, depositing a gate spacer layer on the first sidewall and the second sidewall of the dummy electrode layer, removing the dummy electrode layer to form a gate trench, and depositing a metal gate stack in the gate trench. In some embodiments, the method further includes after the first etching process and prior to the second etching process, etching a middle portion of the dummy electrode layer in a third etching process, the first, second, and third etching processes using different etching recipes. In some embodiments, the etching of the middle portion of the dummy electrode layer forms a third sidewall between the first and second sidewalls, and the third sidewall is tapered from the first sidewall. In some embodiments, the second sidewall is further tapered from the third sidewall. In some embodiments, the first sidewall is substantially vertical. In some embodiments, the second etching process has an etching strength less than that of the first etching process.

In yet another exemplary aspect, the present disclosure is directed to a semiconductor device. The semiconductor device includes a substrate, a plurality of channel layers vertically stacked and suspended above the substrate, and a gate structure wrapping around each of the channel layers, the gate structure having a first gate critical dimension (CD) measured at a height above a top surface of a topmost one of the channel layers, a second gate CD measured at an edge of the topmost one of the channel layers, and a third gate CD measured at an edge of a bottommost one of the channel layers, and the second gate CD being larger than the first gate CD, and the third gate CD being larger than the second gate CD. In some embodiments, the gate structure includes a protruding corner at an intersecting region of the gate structure and the channel layers, and wherein a tip of the protruding corner is above the top surface of the topmost one of the channel layers. In some embodiments, the gate structure includes a void trapped in the protruding corner. In some embodiments, the gate structure includes a vertical sidewall ended above the top surface of the topmost one of the channel layers and a tapering sidewall starting above the top surface of the topmost one of the channel layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

providing a structure that includes a substrate and a fin protruding from the substrate;

depositing a dummy material stack over the fin;

patterning a top portion of the dummy material stack in a first etching process, the first etching process having a first etching strength;

patterning a middle portion of the dummy material stack in a second etching process, the second etching process having a second etching strength that is weaker than the first etching strength;

patterning a bottom portion of the dummy material stack in a third etching process, thereby forming a dummy gate stack, the third etching process having a third etching strength that is weaker than the second etching strength; and replacing the dummy gate stack with a metal gate stack.

2. The method of claim 1, wherein the first etching process produces a substantially vertical sidewall of the top portion of the dummy material stack.

3. The method of claim 2, wherein the second etching process produces a tapering sidewall of the middle portion of the dummy material stack.

4. The method of claim 2, wherein the third etching process produces a tapering sidewall of the bottom portion of the dummy material stack.

5. The method of claim 1, wherein the third etching process produces a polymer byproduct deposited on a tapering sidewall of the bottom portion of the dummy material stack.

6. The method of claim 5, wherein the first and second etching processes are free of producing the polymer byproduct.

7. The method of claim 1, wherein the first etching process stops at a height above a top surface of the fin.

8. The method of claim 7, wherein the height above the top surface of the fin ranges from about 10 nm to about 20 nm.

9. The method of claim 7, wherein the second etching process stops at the top surface of the fin.

10. The method of claim 1, wherein the metal gate stack has a first gate critical dimension (CD) measured at an edge of the fin and a second gate CD measured at a location distant from the fin, and the first gate CD is larger than the second gate CD.

11. A method of forming a semiconductor device, comprising:

forming a fin protruding from a substrate;

depositing a dummy electrode layer over the fin;

etching a top portion of the dummy electrode layer in a first etching process to form a first sidewall above a top surface of the fin;

etching a bottom portion of the dummy electrode layer in a second etching process to form a second sidewall under the top surface of the fin, wherein the first and second etching processes use different etching recipes, and the second sidewall is tapered from the first sidewall;

depositing a gate spacer layer on the first sidewall and the second sidewall of the dummy electrode layer;

removing the dummy electrode layer to form a gate trench; and depositing a metal gate stack in the gate trench.

12. The method of claim 11, further comprising:

after the first etching process and prior to the second etching process, etching a middle portion of the dummy electrode layer in a third etching process, wherein the first, second, and third etching processes use different etching recipes.

13. The method of claim 12, wherein the etching of the middle portion of the dummy electrode layer forms a third sidewall between the first and second sidewalls, and the third sidewall is tapered from the first sidewall.

14. The method of claim 13, wherein the second sidewall is further tapered from the third sidewall.

15. The method of claim 11, wherein the first sidewall is substantially vertical.

16. The method of claim 11, wherein the second etching process has an etching strength less than that of the first etching process.

17. A semiconductor device, comprising:
a substrate;
a plurality of channel layers vertically stacked and suspended above the substrate; and
a gate structure wrapping around each of the channel layers,
wherein the gate structure has a first gate critical dimension (CD) measured at a height above a top surface of a topmost one of the channel layers, a second gate CD measured at an edge of the topmost one of the channel layers, and a third gate CD measured at an edge of a bottommost one of the channel layers, and wherein the second gate CD is larger than the first gate CD, and the third gate CD is larger than the second gate CD,
wherein the first gate CD, the second gate CD, and the third gate CD are measured along a lengthwise direction of the channel layers.

18. The semiconductor device of claim 17, wherein the gate structure includes a protruding corner at an intersecting region of the gate structure and the channel layers, and wherein a tip of the protruding corner is above the top surface of the topmost one of the channel layers.

19. The semiconductor device of claim 18, wherein the gate structure includes a void trapped in the protruding corner.

20. The semiconductor device of claim 17, wherein the gate structure includes a vertical sidewall ended above the top surface of the topmost one of the channel layers and a tapering sidewall starting above the top surface of the topmost one of the channel layers.

* * * * *